US009466793B2

(12) United States Patent
Cho et al.

(10) Patent No.: US 9,466,793 B2
(45) Date of Patent: Oct. 11, 2016

(54) MEMRISTORS HAVING AT LEAST ONE JUNCTION

(75) Inventors: Hans S Cho, Palo Alto, CA (US); Jianhua Yang, Palo Alto, CA (US); Janice H Nickel, Pacifica, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 19 days.

(21) Appl. No.: 13/881,452

(22) PCT Filed: Oct. 29, 2010

(86) PCT No.: PCT/US2010/054610
§ 371 (c)(1),
(2), (4) Date: Nov. 25, 2013

(87) PCT Pub. No.: WO2012/057772
PCT Pub. Date: May 3, 2012

(65) Prior Publication Data
US 2014/0097398 A1 Apr. 10, 2014

(51) Int. Cl.
*H01L 47/00* (2006.01)
*H01L 45/00* (2006.01)
(Continued)

(52) U.S. Cl.
CPC ......... *H01L 45/1253* (2013.01); *H01L 27/101* (2013.01); *H01L 27/2463* (2013.01); *H01L 27/2472* (2013.01); *H01L 45/08* (2013.01); *H01L 45/124* (2013.01); *H01L 45/1233* (2013.01); *H01L 45/1266* (2013.01); *H01L 45/1273* (2013.01); *H01L 45/146* (2013.01); *H01L 45/16* (2013.01); *H01L 45/1608* (2013.01); *H01L 45/1683* (2013.01)

(58) Field of Classification Search
CPC ........ H01L 45/00; H01L 27/24; H01L 21/28
USPC ....... 257/4, E21.158, E45.002; 438/104, 382
See application file for complete search history.

(56) References Cited

U.S. PATENT DOCUMENTS 5,687,112 A * 11/1997 Ovshinsky .................... 365/163
6,429,064 B1 * 8/2002 Wicker ......................... 438/238
6,534,781 B2 * 3/2003 Dennison ......................... 257/5
(Continued)

FOREIGN PATENT DOCUMENTS

KR    10-2010-0002260 A    1/2010
KR       10-0965991 B1      6/2010

OTHER PUBLICATIONS

International Search Report, May 30, 2011, PCT Application No. PCT/US2010/054610.
(Continued)

*Primary Examiner* — Caleb Henry
(74) *Attorney, Agent, or Firm* — Hewlett-Packard Patent Department

(57) ABSTRACT

Memristive devices, memristors and methods for fabricating memristive devices are disclosed. In one aspect, a memristor includes a first electrode wire and a second electrode wire. The second electrode wire and the first electrode wire define an overlap area. The memristor includes an electrode extension in contact with the first electrode wire and disposed between the first and second electrode wires. At least one junction is disposed between the second electrode wire and the electrode extension. Each junction contacts a portion of the electrode extension and has a junction contact area with the second electrode wire, and the sum total junction contact area of the at least one junction is less than the overlap area.

13 Claims, 18 Drawing Sheets

(51) Int. Cl.
*H01L 27/10* (2006.01)
*H01L 27/24* (2006.01)

(56) References Cited

U.S. PATENT DOCUMENTS

| | | | | |
|---|---|---|---|---|
| 6,555,860 | B2* | 4/2003 | Lowrey et al. | 257/296 |
| 6,593,176 | B2* | 7/2003 | Dennison | 438/200 |
| 6,597,009 | B2* | 7/2003 | Wicker | 257/4 |
| 6,617,192 | B1* | 9/2003 | Lowrey et al. | 438/95 |
| 6,621,095 | B2* | 9/2003 | Chiang et al. | 257/5 |
| 6,933,516 | B2* | 8/2005 | Xu | 257/4 |
| 6,943,365 | B2* | 9/2005 | Lowrey et al. | 257/3 |
| 7,078,273 | B2* | 7/2006 | Matsuoka et al. | 438/128 |
| 7,115,927 | B2* | 10/2006 | Hideki et al. | 257/296 |
| 7,164,147 | B2* | 1/2007 | Lee et al. | 257/4 |
| 7,169,635 | B2* | 1/2007 | Kozicki | 438/95 |
| 7,220,983 | B2* | 5/2007 | Lung | 257/4 |
| 7,314,776 | B2* | 1/2008 | Johnson et al. | 438/95 |
| 7,317,201 | B2* | 1/2008 | Gutsche et al. | 257/4 |
| 7,323,349 | B2 | 1/2008 | Hsu et al. | |
| 7,364,935 | B2* | 4/2008 | Lung | 438/69 |
| 7,449,710 | B2* | 11/2008 | Lung | 257/2 |
| 7,485,891 | B2* | 2/2009 | Hamann et al. | 257/2 |
| 7,569,844 | B2* | 8/2009 | Lung | 257/2 |
| 7,569,845 | B2* | 8/2009 | Chen et al. | 257/3 |
| 7,599,216 | B2* | 10/2009 | Suh et al. | 365/163 |
| 7,642,125 | B2* | 1/2010 | Lung et al. | 438/102 |
| 7,872,908 | B2* | 1/2011 | Suh et al. | 365/163 |
| 8,729,521 | B2* | 5/2014 | Lung et al. | 257/3 |
| 2002/0070457 | A1* | 6/2002 | Sun et al. | 257/774 |
| 2004/0063274 | A1 | 4/2004 | Hsu et al. | |
| 2004/0201070 | A1 | 10/2004 | Deak | |
| 2006/0124916 | A1* | 6/2006 | Lung | 257/4 |
| 2007/0117256 | A1 | 5/2007 | Stewart et al. | |
| 2007/0158645 | A1 | 7/2007 | Lung | |
| 2007/0298535 | A1* | 12/2007 | Lung | 438/102 |
| 2008/0014750 | A1 | 1/2008 | Nagashima | |
| 2008/0090337 | A1 | 4/2008 | Williams | |
| 2008/0137400 | A1* | 6/2008 | Chen et al. | 365/163 |
| 2008/0138930 | A1* | 6/2008 | Lung | 438/102 |
| 2008/0220601 | A1 | 9/2008 | Kumar et al. | |
| 2008/0258125 | A1 | 10/2008 | Liu et al. | |
| 2008/0316794 | A1* | 12/2008 | Philipp et al. | 365/148 |
| 2009/0014706 | A1 | 1/2009 | Lung | |
| 2009/0017577 | A1* | 1/2009 | An et al. | 438/102 |
| 2009/0289241 | A1* | 11/2009 | Suh et al. | 257/2 |
| 2009/0321706 | A1 | 12/2009 | Happ et al. | |
| 2010/0065808 | A1* | 3/2010 | Lung et al. | 257/5 |
| 2010/0155686 | A1 | 6/2010 | Bratkovski et al. | |
| 2011/0049458 | A1* | 3/2011 | Ahn et al. | 257/2 |
| 2011/0278528 | A1* | 11/2011 | Lung et al. | 257/2 |
| 2012/0267597 | A1* | 10/2012 | Lung | 257/4 |
| 2013/0306931 | A1* | 11/2013 | Lung | 257/4 |
| 2014/0256110 | A1* | 9/2014 | Lung et al. | 438/382 |

OTHER PUBLICATIONS

Xia, Qiangfei, et al. "Self-aligned memristor cross-point arrays fabricated with one nanoimprint lithography step." Nano letters 10.8 (2010): 2909-2914.

* cited by examiner

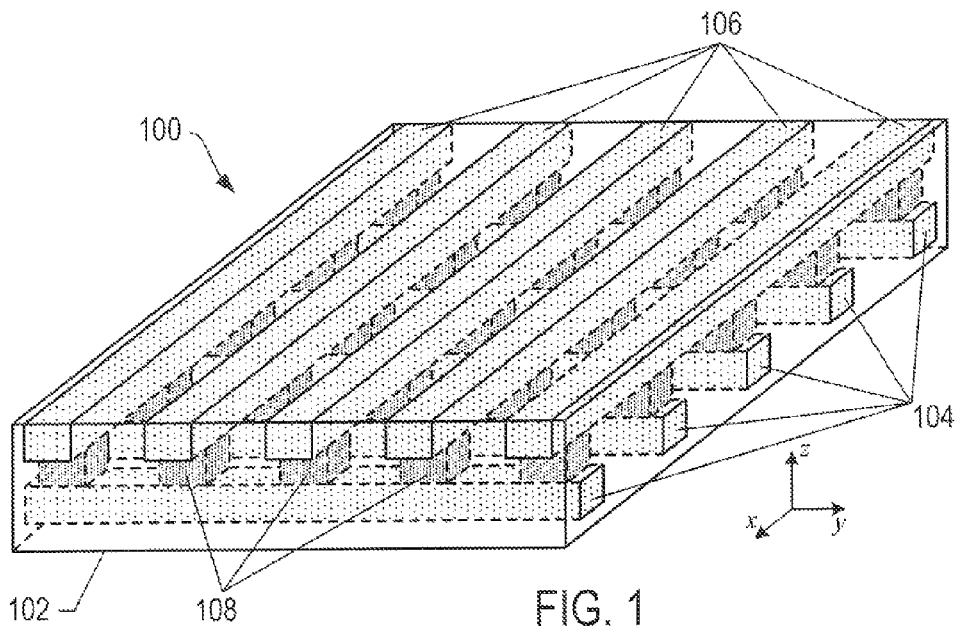
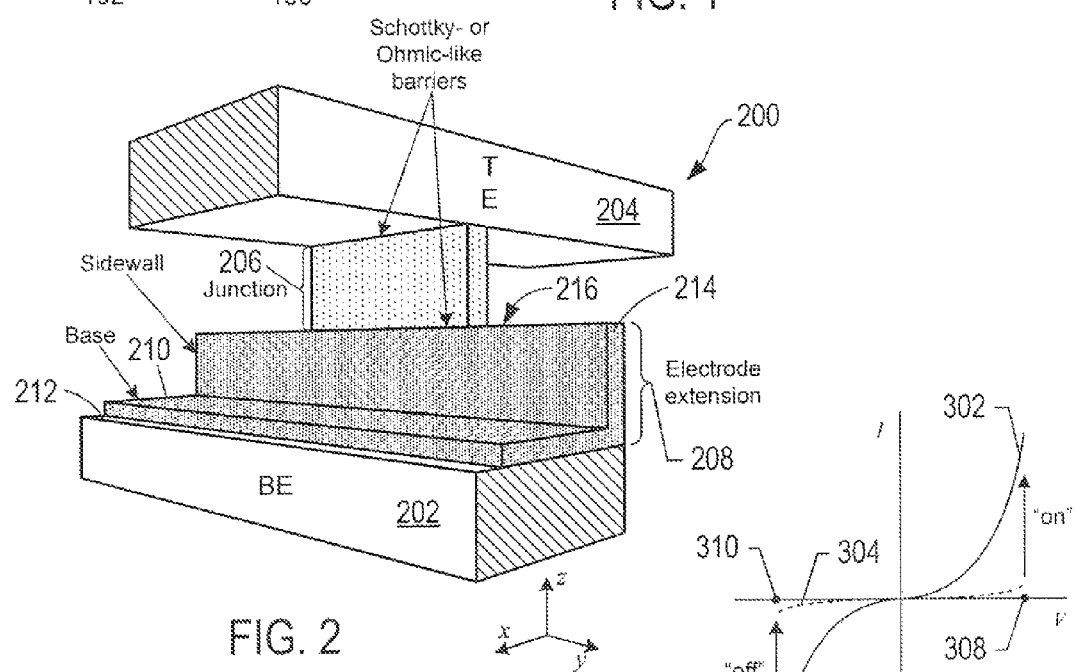
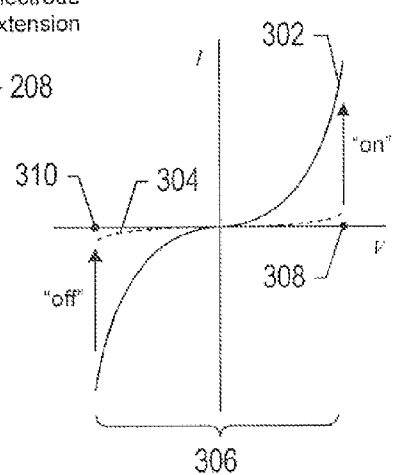

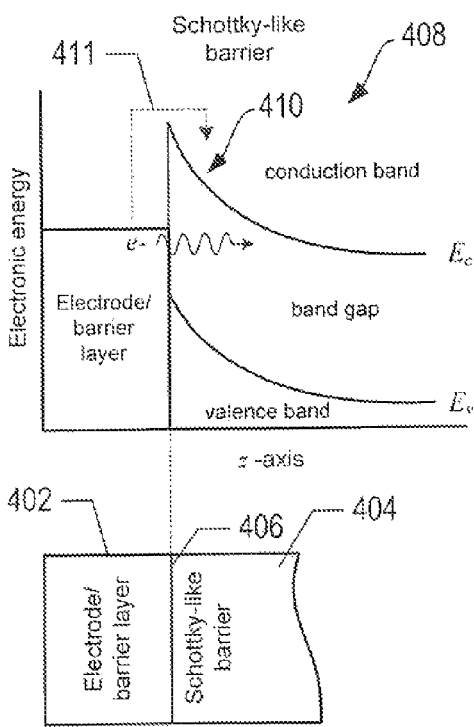 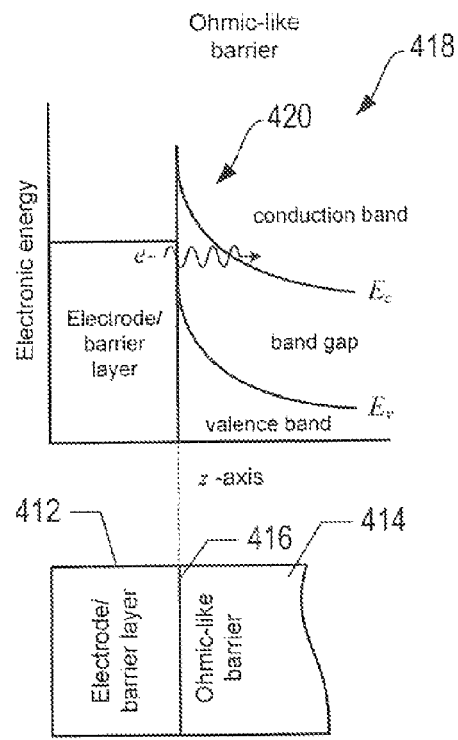
FIG. 4A  FIG. 4B
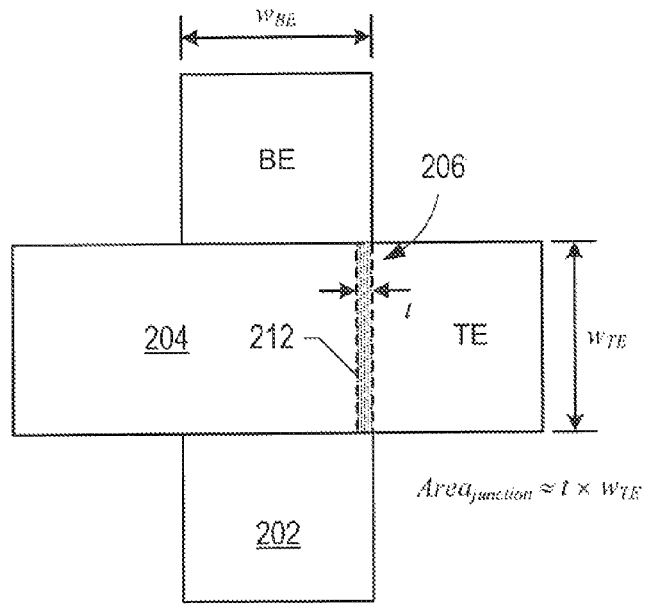
FIG. 5

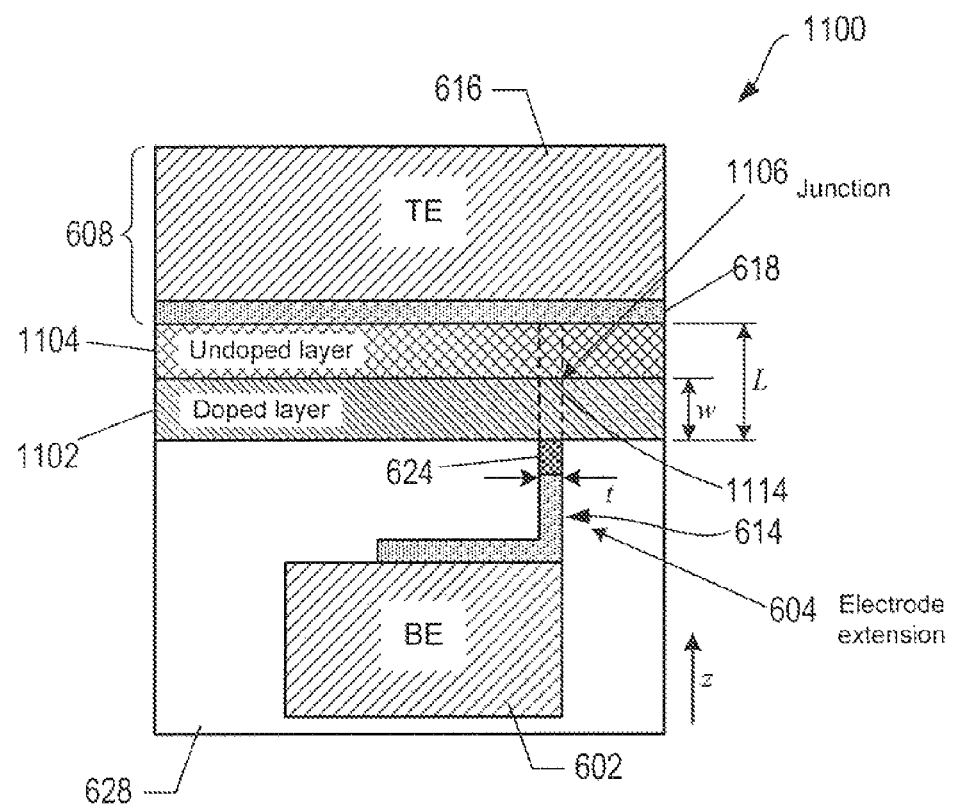
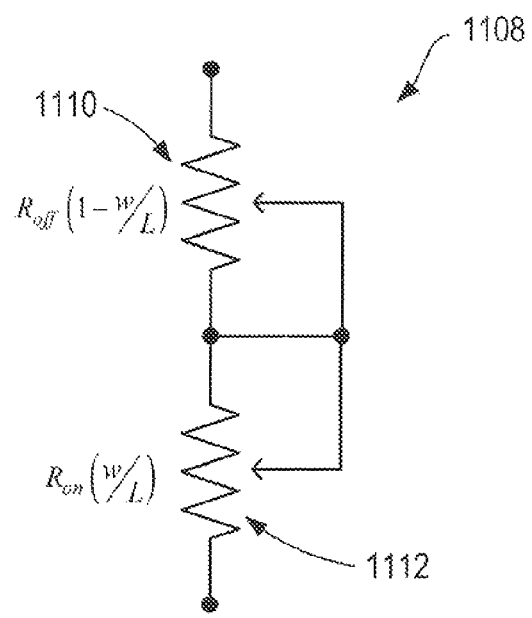
FIG. 11

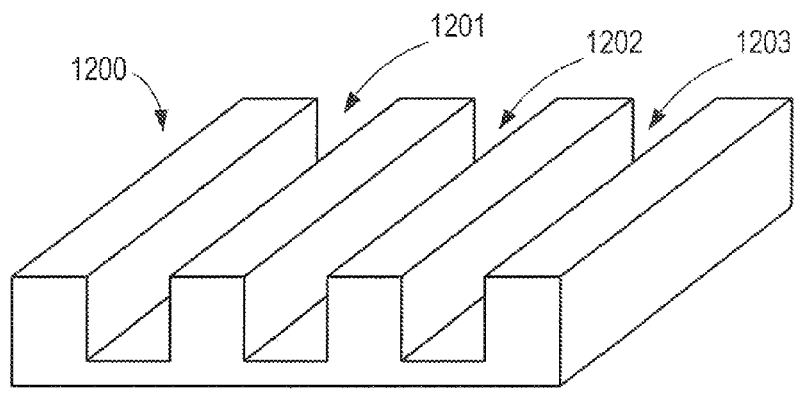
FIG. 12A
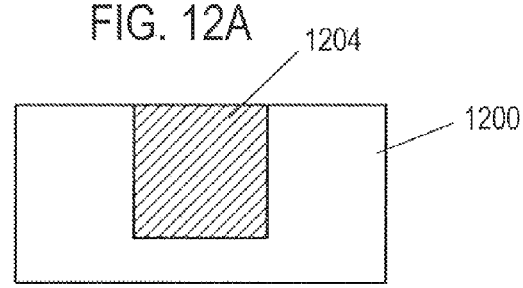
FIG. 12B
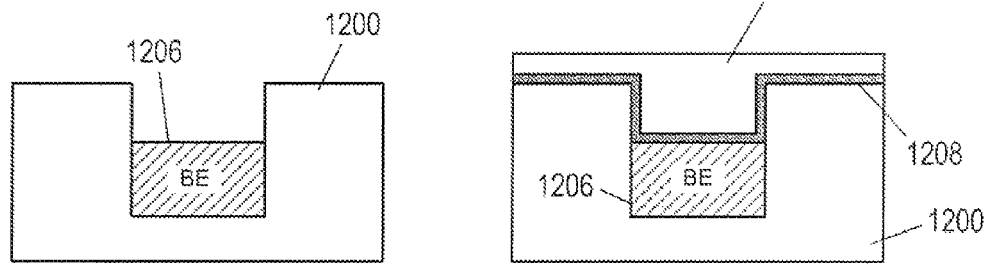
FIG. 12C     FIG. 12E
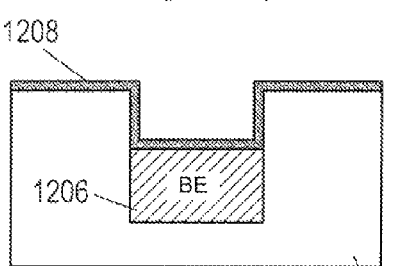
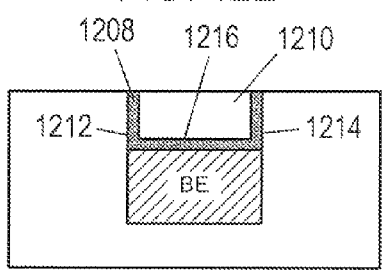
FIG. 12D     FIG. 12F

MEMRISTORS HAVING AT LEAST ONE JUNCTION

TECHNICAL FIELD

This disclosure relates to memristors and memristive devices.

BACKGROUND

Significant research and development efforts are currently directed to designing and manufacturing nanoscale electronic devices. Nanoscale electronics promise significant advantages, including considerably reduced features sizes and the potential for self-assembly and for other relatively inexpensive, non-photolithography-based fabrication methods. However, the design and manufacture of nanoscale electronic devices present many new challenges when compared with the current state-of-the-art.

Studies of switching in nanoscale electronic devices have previously reported that these devices could be reversibly switched and had an "on-to-off" conductance ratio of approximately $10^4$. These nanoscale devices may be used to construct crossbar circuits and provide a promising route for the creation of ultra-high density memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. Because nanoscale electronic devices offer an abundance of potential advantages, engineers, chemists, and physicists continue to seek improvements in the performance and manufacture of these devices.

BRIEF DESCRIPTION OF THE DRAWINGS

FIG. 1 shows an isometric view of a crossbar array embedded in an insulating material.

FIG. 2 shows a perspective view of an example memristor of a crossbar array.

FIG. 3 shows an example plot of current I versus voltage V for a typical nanoscale memristor.

FIG. 4A shows an electronic band diagram of a Schottky-like barrier at an electrode/junction interface.

FIG. 4B shows an electronic band diagram of an Ohmic-like barrier at an electrode/junction interface.

FIG. 5 shows a top view of an example memristor.

FIG. 11 shows a cross-sectional view of a memristor along a bottom electrode.

FIGS. 12A-12M show isometric and cross-sectional views of stages of method for fabricating a memristive crossbar array.

DETAILED DESCRIPTION

Figure 6A:
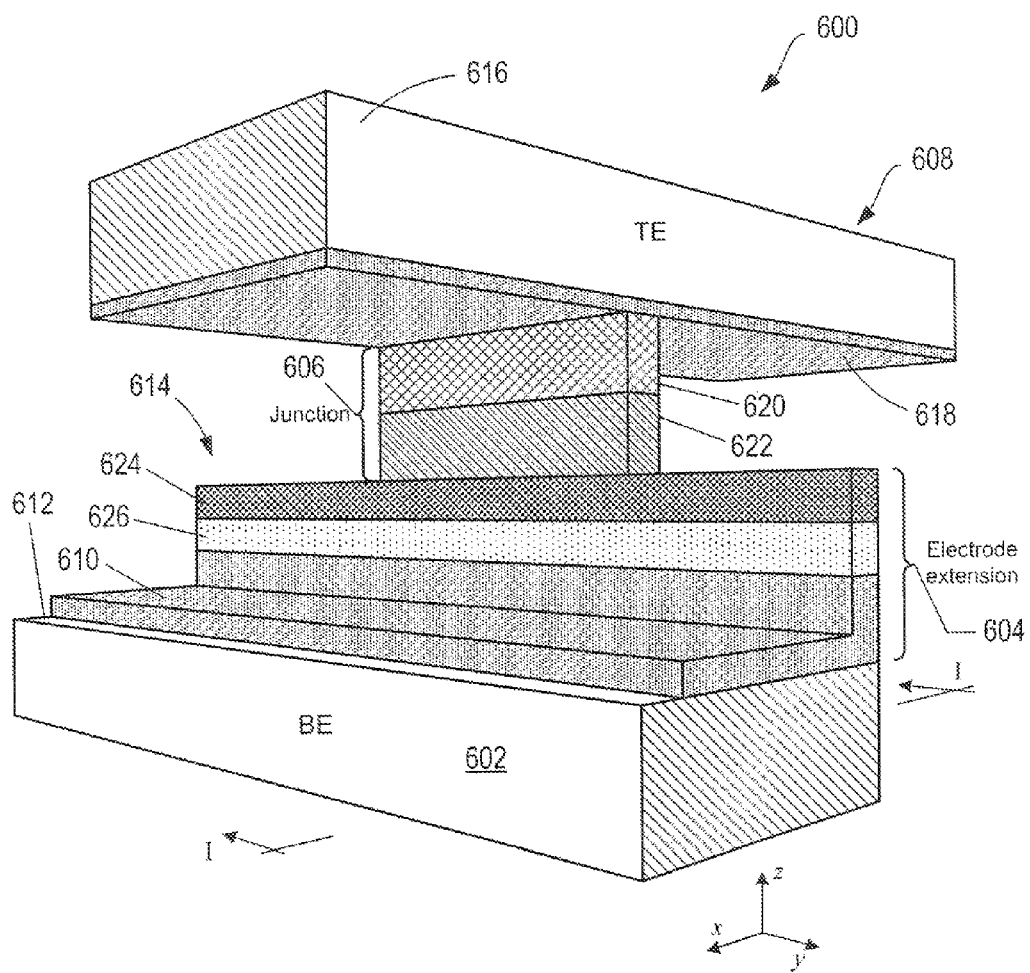
FIG. 6A shows a perspective view of an example memristor.

A typical memristor includes two electrodes connected by a junction. The two electrodes overlap defining an overlap area with the area of the junction often larger than the overlap area. The junction is capable of being switched between a high resistance state and a low resistance state by applying switching voltages with magnitudes that are greater than operating voltages used to probe the resistance state of the junction. However, it may be desirable to incorporate memristors into circuits where the magnitude of the currents available to switch and operate the memristors is smaller than the currents used to switch and operate typical memristors. One possible solution is to reduce the overall size of the memristor, but this may not be possible using conventional lithographic techniques when electrode widths are already reaching achievable size limits. In addition, even assuming desired electrode sizes can be achieved with current or future lithographic techniques, simply reducing the size of the electrodes increases electrode resistance, which in turn reduces the life of the memristor and increases the power consumption and the risk of electrode burn up during switching.

This disclosure is directed to memristive devices and memristors, where each memristor includes an electrode extension that forms at least one ribbon-like junction connecting the two memristor electrodes. Each ribbon-like junction has a contact area with one of the two memristor electrodes and the sum total of the at least one contact area is smaller than the overlap area defined by the two electrodes. This disclosure is also directed to methods for fabricating memristive devices with electrode extensions.

This disclosure is organized into two subsections: Memristors and memristive devices are described in a first subsection. Methods for fabricating memristive devices with electrode extensions are described in a second subsection.

Memristors and Memristive Devices

FIG. 1 shows an isometric view of an example crossbar array 100 embedded within an insulating material 102. The crossbar array 100 includes a first layer of approximately parallel nanowires 104 overlain by a second layer of approximately parallel nanowires 106. In the example of FIG. 1, the nanowires of the second layer 106 are approximately perpendicular in orientation to the nanowires of the first layer 104, although in practice the orientation angle between the layers may vary. The two layers of nanowires form a lattice, or crossbar, where each nanowire of the second layer 106 overlays substantially all of the nanowires of the first layer 104 and comes into close contact with each nanowire of the first layer 104 at nanowire intersections that represent the closest contact between two nanowires. At each nanowire intersection, a junction composed of a nonvolatile resistive switching material is disposed between the two overlapping nanowires to form a memristive crossbar junction also called a memristor. For example, as shown in FIG. 1, blocks 108 each represent junctions that form three memristive crossbar junctions.

Although the nanowires of the crossbar array 102 are shown with rectangular cross sections, nanowires can also have square, trapezoidal, circular, elliptical, or more complex cross-sectional geometries. The nanowires may also have many different widths, diameters, aspect ratios, or eccentricities. The term "crossbar" may refer to crossbars having at least two layers of nanowires, sub-microscale wires, microscale wires, or wires with larger dimensions.

FIG. 2 shows a perspective view of an example memristor 200 of the crossbar array 100. The memristor 200 includes a first nanowire 202 that serves as a bottom electrode wire denoted by BE, a second layer nanowire 204 that servos as a top electrode wire denoted by TE, a ribbon-like junction 206, and an electrode extension 208 disposed on the BE 202. The insulating material in which the memristor 200 is embedded is not represented in FIG. 2 for the sake of clarity. In the example shown in FIG. 2, the electrode extension 208 has an L-shaped cross section along the BE 204 and includes a base 210 that contacts the top surface 212 of the BE 202 and includes a sidewall 214 that contacts the junction 206. The junction 206 is composed of a nonvolatile material that can be switched between a high resistance state and a low resistance states when a voltage, called a switching voltage, of an appropriate magnitude and polarity is applied to at least one of the electrode wires 202 and 204.

FIG. 3 shows an example plot of current I versus voltage V for a typical nanoscale memristor. Solid curve 302 represents the current of the memristor in a low-resistance state, and dashed nonlinear curve 304 represents the memristor in as high-resistance state. Applying voltages that fall within the voltage range 306 have negligible effect on the resistance state of the memristor and are referred to as operating voltages that can be used to determine the resistance state of the memristor. On the other hand, switching voltages are larger magnitude voltages that fall outside the range 306 and are applied to switch the memristor's resistance state. For example, applying a positive switching voltage with a magnitude greater than the positive "on" threshold 308 switches the memristor from the high-resistance state 304 into the low-resistance state 302. Applying a negative switching voltage with a magnitude less than the negative "off" threshold 310 switches the memristor from the low-resistance state 302 into the high-resistance state 304. The terms "positive" and "negative" refer to voltages with opposite polarities.

Returning to FIG. 2, the junction 206 includes at least one type of dopant that affects the resistance state of the memristor 200. A switching voltage generates an electric field, also called a "drift field," across the junction 206. When the magnitude of the drift field exceeds a drift threshold, the dopants within the junction 206 become mobile and drift in and out of different sub-regions of the junction 206. For example, creating a drift field that drives dopants from a first sub-region into a second sub-region changes the resistance state of the first and second sub-regions. In other words, the junction 206 can be switched from a high-resistance state to a low-resistance state, as described above with reference to FIG. 3, by applying a switching voltage that creates a drift field that, in turn, drives the dopants into different sub-regions of the junction 206.

The composition of the junction and dopants are selected so that dopant drift in or out of different sub-regions of the junction is possible but not too facile in order to prevent dopants from diffusing in or out of different regions of the junction 206 when no voltage or an operating voltage is applied. In other wards, one potentially useful property of the junction 206 is that it can be a weak ionic conductor. The definition of a weak ionic conductor depends on the intended use of the memristor 200. The mobility $\mu_d$ and the diffusion constant D of a dopant in a lattice material are related by Einstein's equation:

$$D \approx \mu_d kT$$

where k is Boltzmann's constant, and T is an absolute temperature, if the mobility $\mu_d$ of a dopant in a lattice is high so is the diffusion constant D. In general, it is desirable for the junction 206 be non-volatile. in other words, the junction 206 can maintain a particular resistance state for an amount of time that may range from a fraction of a second to years, depending on the application and composition of the junction. This is accomplished by selecting the junction 206 materials and dopants to that the dopant mobility $\mu_d$ and the diffusion constant D are small enough to ensure the non-volatility of the junction 206 for as long as necessary under the desired conditions. As a result, changes in the resistance state of the junction 206 that are due to ionized dopant diffusion can be avoided, and the resistance state of the junction 206 can be intentionally set with an appropriate voltage. This ensures that the junction 206 is nonvolatile by retaining its resistance state even after the drift field has been removed. On the other hand, strong ionic conductors have relatively larger dopant mobilities and may be unstable against diffusion. Note that this relationship breaks down for high electric fields, which causes the mobility to become exponentially dependent on the field.

Depending on the composition of as memristor, the resistivity of a memristor can be controlled in at least two different ways. For certain memristor device compositions, switching the resistance of the memristor device may be controlled at the active region/electrode interfaces in a switching process called "interface switching." For other memristor device compositions, the electronic barriers at the interfaces may be relatively small and contribute little to the device resistance. With these type of memristors, resistance switching may be performed within the bulk materials of the active region in a process called "bulk switching."

Interface Switching

FIG. 2 also identifies two interfaces between the junction 206 and the TE 204 and between the junction 206 and the top edge 216 of the sidewall 214. The electronic properties of =doped electrode/junction interfaces electronically resemble Schottky barriers and are called "Schottky-like contacts." and the electronic properties of doped electrode/junction interfaces electronically resemble Ohmic barriers and are called "Ohmic-like contacts." For an electrode of a given workfunction, a low concentration of dopants in the junction 206 near the TE 204 creates a Schottky-like barrier adjacent to the TE 204, and likewise, is low concentration of &pants in the junction 206 near the sidewall 214 creates a Schottky-like barrier adjacent to the sidewall 214. On the other hand, a high concentration of dopants in the junction 206 near the TE 204 creates an Ohmic-like barrier adjacent to the TE 204, and likewise, a high concentration of dopants in the junction 206 near the sidewall 214 creates an Ohmic-like barrier adjacent to the sidewall 214.

FIG. 4A shows an electronic hand diagram 408 that represents the electronic properties of as Schottky-like barrier at an electrode 402/junction 404 interface 406. When the junction 404 near the electrode 402 has a low dopant concentration or is essentially intrinsic, the tunneling barrier is a Schottky-like barrier 410, which can be characterized as high and wide, effectively preventing electrons from tunneling from the electrode 402 into the conduction hand of the junction 404, although, as shown in FIG. 4A, a small concentration of electrons 411 may have enough thermal energy to exceed the barrier and reach the conduction band. Thus, the conductivity through the junction 404 is low and the interface 406 is said to be in an "on" state.

On the other hand, FIG. 4B shows an electronic band diagram 418 that represents the electronic properties of an Ohmic-like barrier at an electrode 412 junction 414 interface 416. Band diagram 418 represents the case where a sufficient number of dopants are located within the junction 414 near the electrode 412. As a result, the tunneling barrier is an Ohmic-like barrier 420 where the width and the height of the tunneling harrier are lower than in the Schottky case, enabling electrons to tunnel from the electrode 412 into the conduction band of the junction 414, which results in an increase in conductivity, and the interface 416 is said to be in an "on" state.

FIG. 5 shows a top view of the example memristor 200 shown in FIG. 2. In FIG. 5, the thickness of the sidewall 214 is denoted by t, the width of the TE 204 is denoted by $w_{TE}$, and the width of the BE 202 is denoted by $w_{BE}$. The overlap area defined by the TE 204 and the BE 202 is $w_{BE} \times w_{TE}$. The thickness of the sidewall 214 defines the approximate thickness, ~t of the ribbon-like junction 206. As a result, the approximate area of the junction 206 in contact with the TE 204, called the "junction contact area," is given by:

$$\text{Area}_{junction} \approx t \times w_{TE}$$

In other words, the sidewall 214 of the electrode extension 208 defines the thickness of the ribbon-like junction 206 resulting in a junction contact area $\sim (t \times w_{TE})$ with the TE 204, which is a fraction of the overlap area $w_{BE} \times w_{TE}$ defined by the TE 204 and the BE 202. By contrast, a junction of a typical memristor fills the region between the TB and the BE, and the approximate area of the junction in contact with the TB, and in contact with the BE, is $w_{BE} \times w_{TE}$.

The sidewall 214, junction 206, and TE 204 of the memristor 200 can be composed of various materials. FIG. 6A shows a perspective view of an example memristor 600. The memristor 600 represents an example composition for the sidewall 214, a ribbon-like junction 206, and TE 204 of the memristor 200. Like the memristor 200, the electrode extension 604 has an L-shaped cross section with a base 610 that contacts a single surface 612 of the BE 602 and includes a sidewall 614 with the junction 606 disposed between the edge of the sidewall 614 and the TB 608. In the example of FIG. 6A, the TE 608, junction 606, and sidewall 614 are layered with different material compositions.

The TE 608 is composed of a metal conductive layer 616 disposed on a first thin metal barrier layer 618 that extends the length of the conductive layer 616. For example, the metal conductive layer 616 can be composed of, but is riot limited to, copper ("Cu"), aluminum ("Al"), tungsten ("W"), gold ("Au"), or platinum ("Pt"); and the first barrier layer 618 can be composed of, but is not limited to, Pt, tungsten ("W"), or titanium nitride ("TiN"). The BE 602 can be also be composed of, but is not limited to, Cu, AL W, Au, or Pt, or any other suitable metal or compound.

As described above with reference to FIG. 2, the memristor toil is embedded within at insulating material. FIG. 613 shows a cross-sectional view of the memristor 600 along a line I-I shown in FIG. 6A. FIG. 613 shows the crossbar junction 600 embedded within an insulating material 628, which can be silicon dioxide "$SiO_2$," aluminum oxide ("$Au_2O_3$") or another suitable dielectric.

Figure 6B:
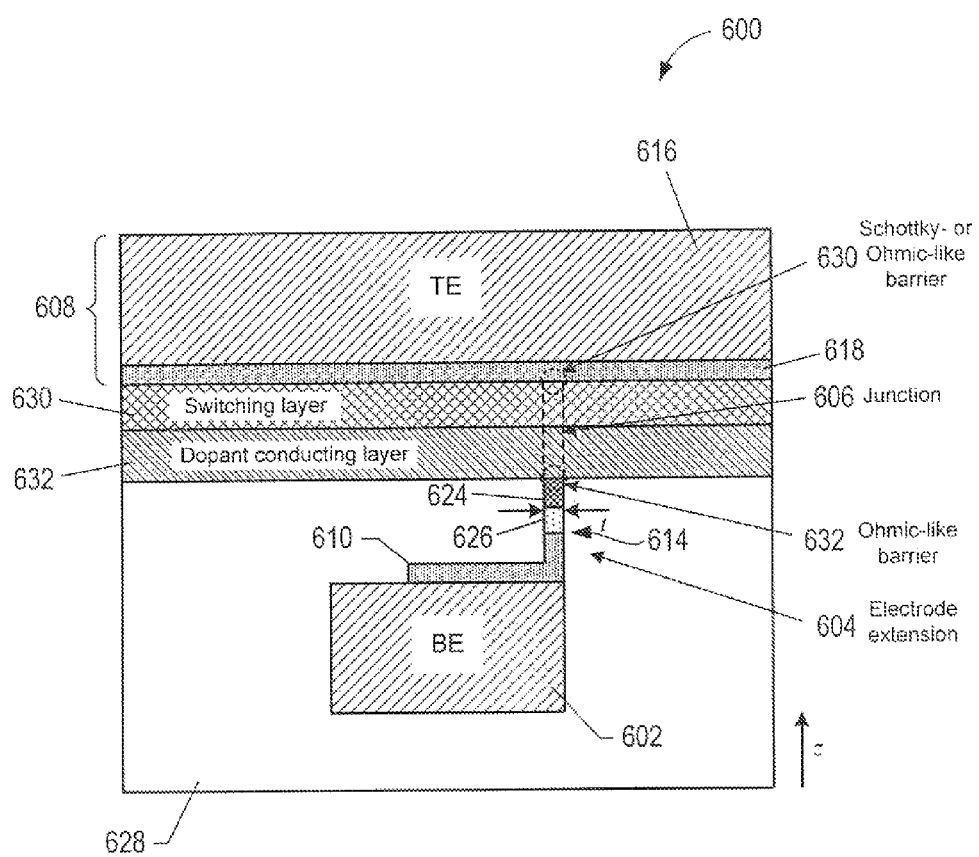
FIG. 6B shows as cross-sectional view of the example memristor shown in FIG. 6A along a line I-I.

FIG. 6B reveals a switching layer 630 and a dopant conductive layer 634. extending parallel to the TE 608. The ribbon-like junction 602. (shown in FIG. 6A) is actually a s of material extending approximately perpendicular to the orientation of the layers 630 and 632 between the first barrier layer 618 of the TE 608 and the sidewall 614 and is composed of a narrow portion of the switching layer 630 and a narrow portion of the dopant conductive layer 632. The thickness of the junction 602 is defined by the thickness t of the sidewall 614. The switching layer 630 can be composed of, but is not limited to, $M_aX_b$, where M represents a metal atom such as, but not limited to, titanium ("Ti"), tantalum ("Ta"), zirconium ("Zr"), nickel ("Ni"), hafnium ("Hf"), niobium ("Nb"), chromium ("Cr"), W, vanadium ("V"), manganese ("Mn"), Cu, and iron ("Fe"), and a and b are positive integers; and X represents a non-metal atom such as, but not limited to, oxygen ("O"), nitrogen ("N"), phosphorus ("P"), and sulfur ("S"). The dopant conductive layer 632 can he composed of other $M_aX_b$.

The sidewall 614 is composed of a second metal barrier layer 624 and an adhesion layer 626. The second barrier layer 624 can be, but is not limited to, Pt, W, or TiN; and the adhesion layer 626 can be composed of one of the metals M. The base and remaining portion of the electrode extension 604 can be composed of a metal conductive material, such as Cu, Al, W, TiN, TaN, or Pt.

The switching layer 630, dopant conductive layer 632, and the adhesion layer 626 can all be selected to have the same metal M and non-metal X. For example, in one example composition, the switching layer 630 can be composed of $TiO_2$, the conductive layer can be composed of $Ti_4O_7$, and the adhesion layer 626 can be composed of Ti.

FIG. 6B also reveals the location of a Schottky-like barrier and an Ohmic-like barrier. The interface 630 between the junction 606 and the first barrier layer 618 can be switched between a Schottky-like barrier and an Ohmic-like barrier, and the interface between the junction 606 and the sidewall 614 is an Ohmic-like barrier. The adhesion layer 626 may be a source of M atoms that under an appropriate switching voltage drift into, or under thermal annealing diffuse into, the switching layer 630 forming X-vacancies that effectively act as n-type mobile dopants under the influence of an appropriate drift field. For example, when the adhesion layer 626 is composed of Ti and the switching layer 630 is composed of $TiO_2$, Ti atoms drift into the switching layer 630 forming O-vacancies that act as n-type mobile dopants. A drift field with an appropriate polarity applied across the junction 606 causes the O-vacancies to drift into the interface 630 to form an Ohmic-like barrier. On the other hand, when the polarity of the drift field is switched, the O-vacancies drift away from the interface 630 to form a Schottky-like barrier.

Figure 6C:
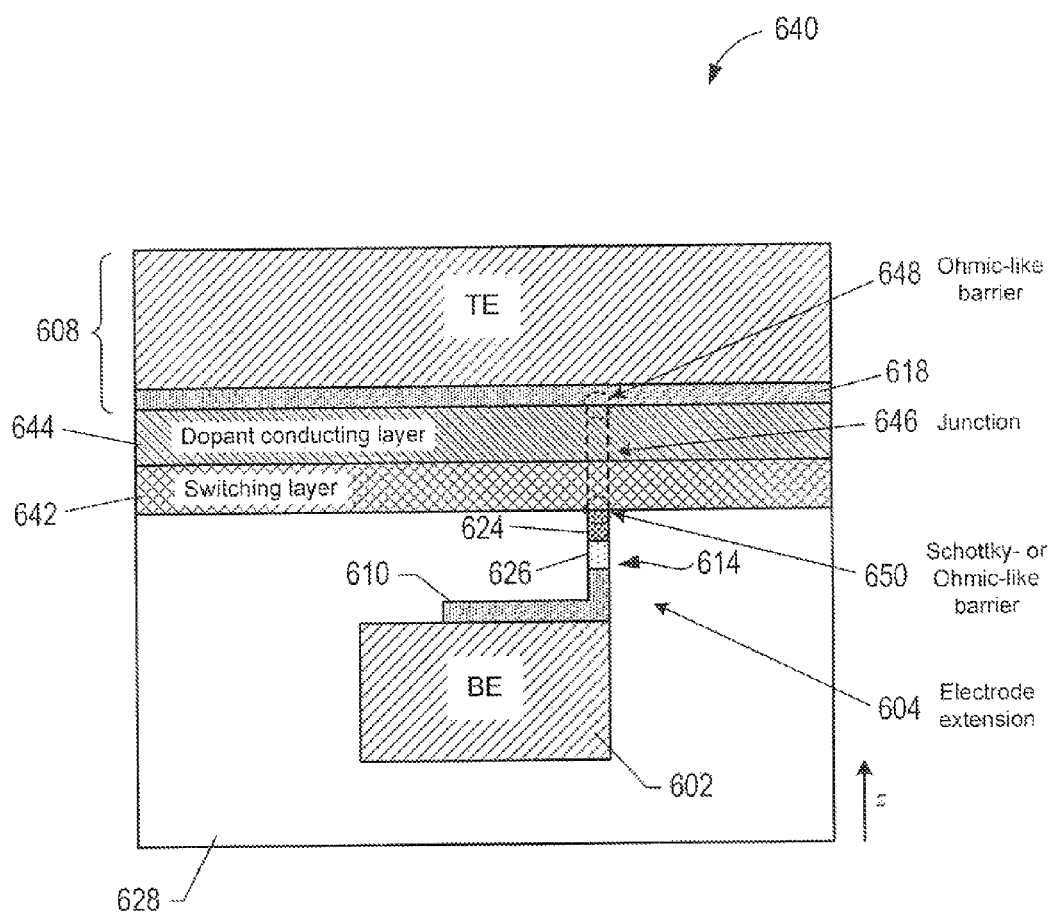
FIG. 6C shows a cross-sectional view of an example memristor.

FIG. 6C shows a cross-sectional view of an example memristor 640. The memristor 640 is similar to the memristor 600 except the switching layer 642 and the dopant conductive layer 644 of the memristor 640 are reversed. As a result, a junction 646 formed between the side wall 614 and the first barrier layer 618 of the TB 608 has an Ohmic-like barrier interface 648 and an interface 650 that can be switched between a Schottky-like barrier and an Ohmic-like barrier.

Figure 7A:
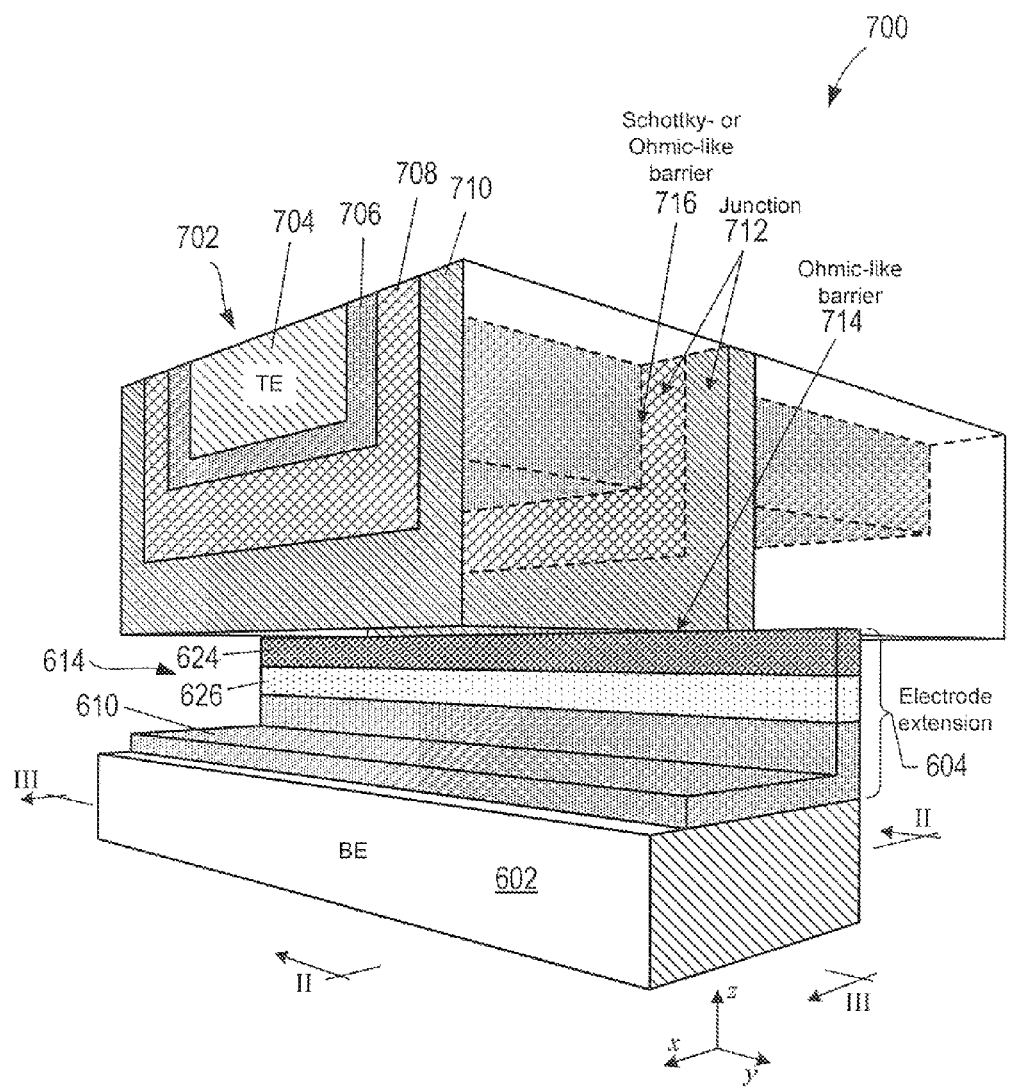
FIG. 7A shows a perspective view of an example memristor.

FIG. 7A shows a perspective view of an example memristor 700. The memristor 700 is similar to the memristor 600 except the memristor 700 includes a TB 702 is composed of a metal conductive layer 704 partially embedded or surrounded by a first metal barrier layer 706. As shown in the example of FIG. 7A, the TE 702 is partially embedded or surrounded by a switching layer 708, which is partially embedded or surrounded by a dopant conductive layer 710. The memristor 700 is embedded in an insulting material not shown) and the TB 702 and the layers 708 and 710 are effectively isolated. The conductive layer 704, barrier layer 706, switching layer 708, and dopant conductive layer 710 can be composed of the same materials as the conductive layer 616, barrier layer 618, switching layer 630, and dopant conductive layer 632 described above with reference to FIG. 6. FIG. 7 also reveals a ribbon-like junction 712 formed between the sidewall 614 of the electrode extension 604. The junction 712 can be U-shaped and is strip of material composed of a U-shaped portion of the switching layer 708 and a U-shaped portion of the dopant conductive layer 710. An Ohmic-like barrier is formed along the junction 712 at the interface 714 between the sidewall 614 and the layer 710, and a switchable Schottky-like or Ohmic-like barrier is formed along the junction 712 at the interface 716 between the first barrier layer 706 and the switchable layer 708.

Figure 7B:
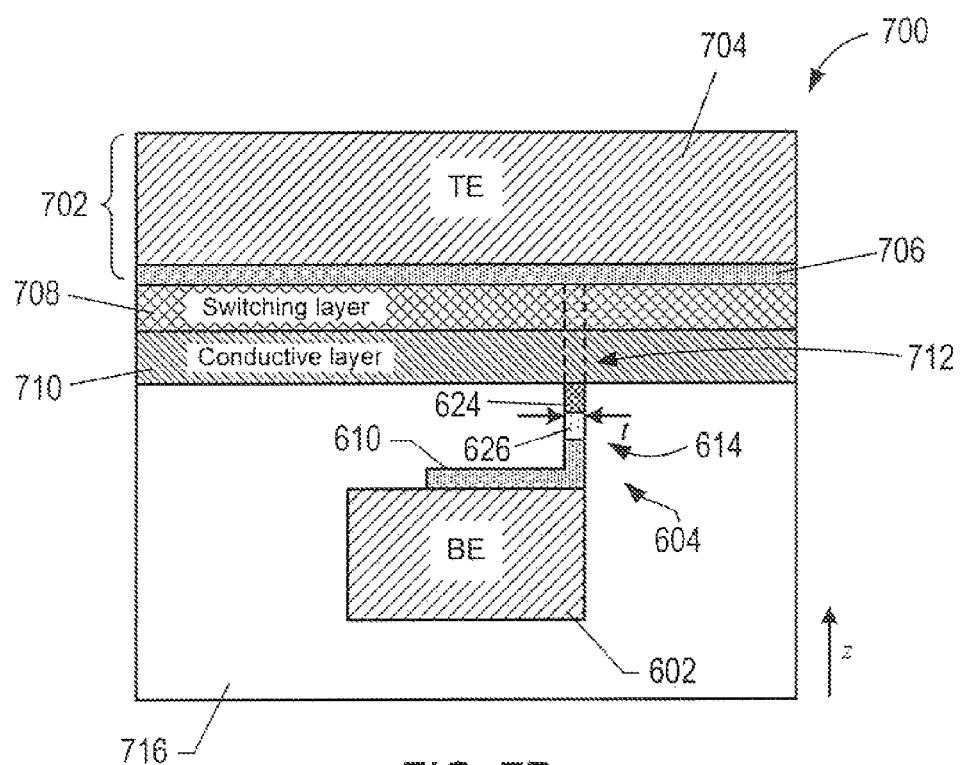
FIG. 7B shows a cross-sectional view of the example memristor shown in FIG. 7A along a line II-II.
Figure 7C:
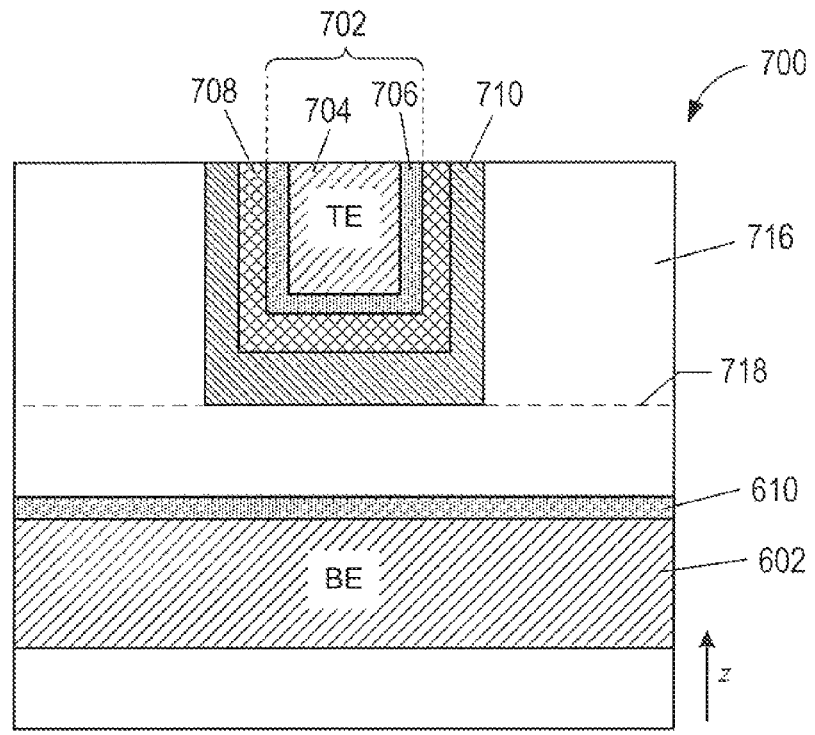
FIG. 7C shows a cross-sectional view of the example memristor shown in FIG. 7A along a line III-III.

FIG. 7B shows a cross-sectional view of the example memristor 700 along a line II-II shown in FIG. 7A. The memristor 700 is embedded in an insulating material 716. Thickness t of the sidewall 614 defines the thickness of the junction 712. FIG. 7B reveals that the memristor 700 has a similar cross section to that of the memristor 600 shown in FIG. 6B. FIG. 7C shows a cross-sectional view of the memristor 700 along a line III-III shown in FIG. 7B and reveals that the TE 702 and layers 708 and 710 are inlaid within the insulating material 716 and effectively isolated. Dashed line 718 reveals the location of the top of the sidewall 604.

Figure 8A:
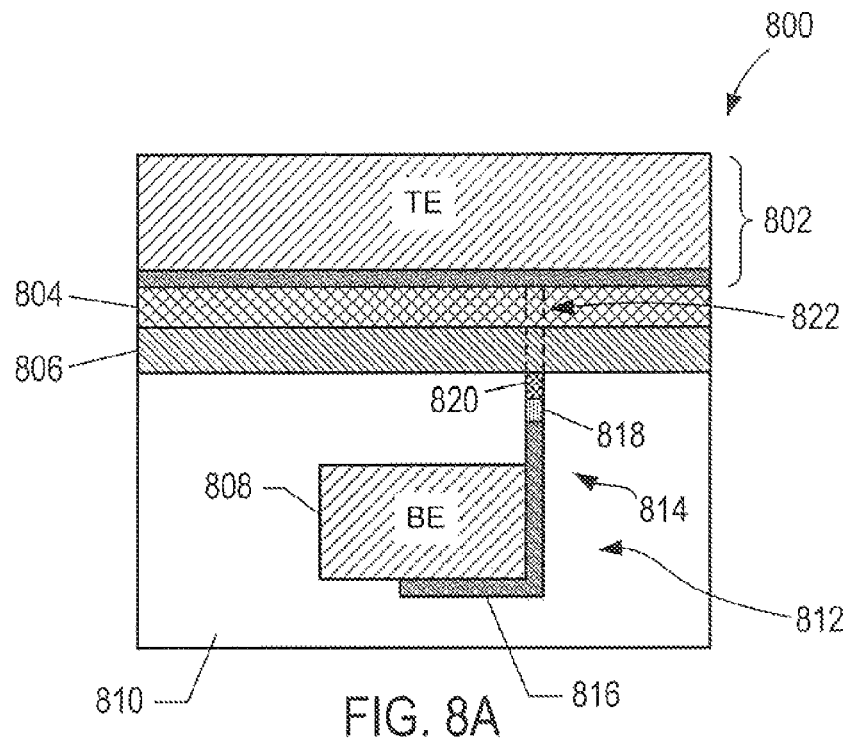
FIG. 8A shows a cross-sectional view of an example memristor.
Figure 8B:
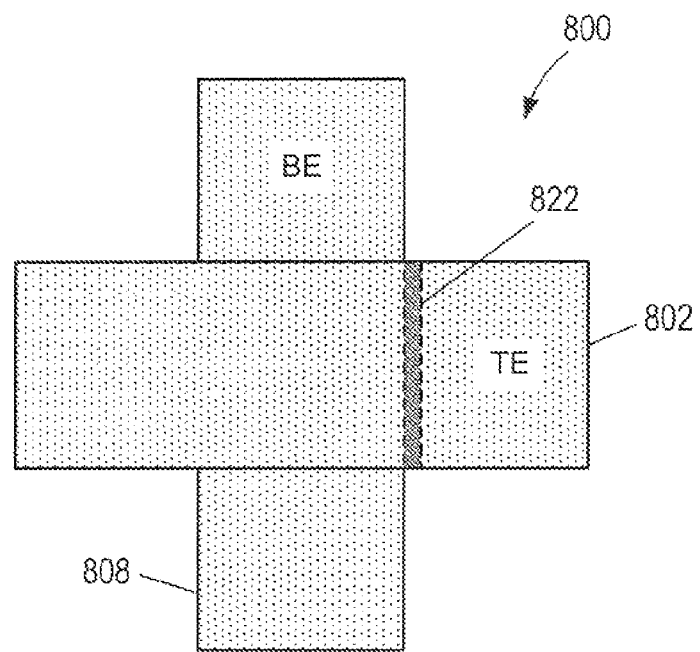
FIG. 8B shows a top view of the example memristor shown in FIG. 8A.

Electrode extensions are not limited to being disposed between the TE and the BE, as shown in FIGS. 2, 5, 6, and 7. FIG. 8A shows a cross-sectional view of an example memristor 800. The memristor 800 includes a TE 802, a switching layer 804, a dopant conductive layer 806, and a BE 808 embedded within an insulating material 810. The TE 802, switching layer 804, dopant conductive layer 806, and BE 808 can be composed of the same materials and configured in the same manner as the electrodes and layers of the memristor 600 or the memristor 700. The memristor 800 also includes an electrode extension 812 with an L-shaped cross-sectional geometry that includes a sidewall 814 and a base 816. The sidewall 814 can include an adhesion layer 818 and a second barrier layer 820. Unlike the L-shaped electrode extensions 208, 604, and 614 described above, the L-shaped electrode extension 812 is configured so that the BE 808 contacts the base 816 and the sidewall 814. The sidewall 814 also defines a ribbon-like junction 822 within the layers 804 and 806 between the end of the sidewall 814 and the TE 802. FIG. 8B shows a top view of the memristor 800. FIGS. 8A-8B reveal that the junction contact area of the ribbon-like junction 822 is a fraction of the overlap area defined by the TE 802 and the BE 808 and the ribbon-like junction 822 is located outside the TE 802 and the BE 808 overlap region, unlike the junctions 206, 606, and 712 described above.

Figure 9A:
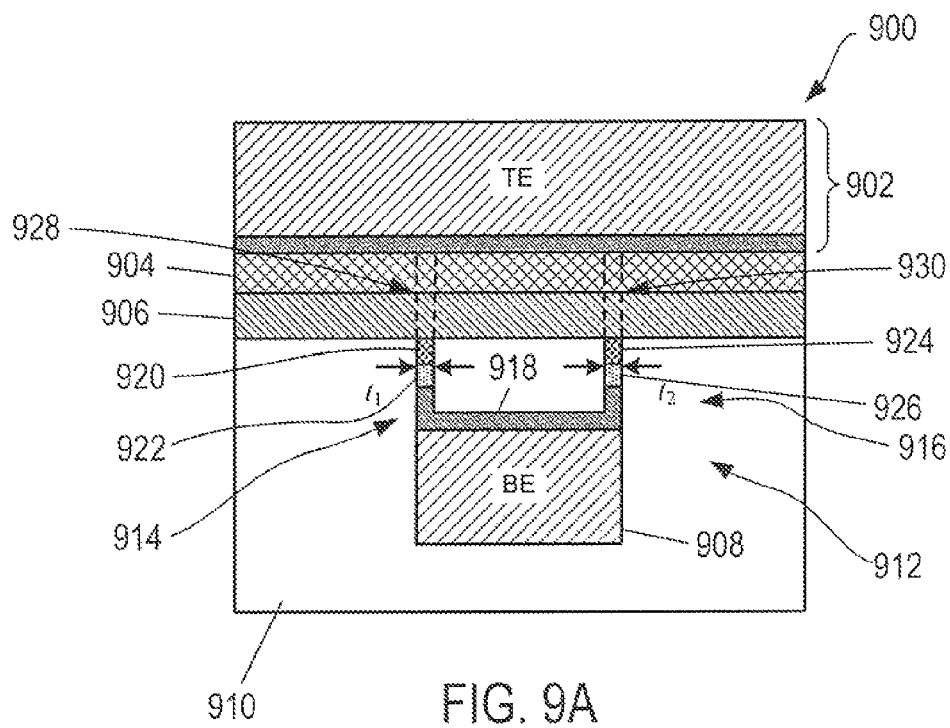
FIG. 9A shows a cross-sectional view of an example memristor.
Figure 9B:
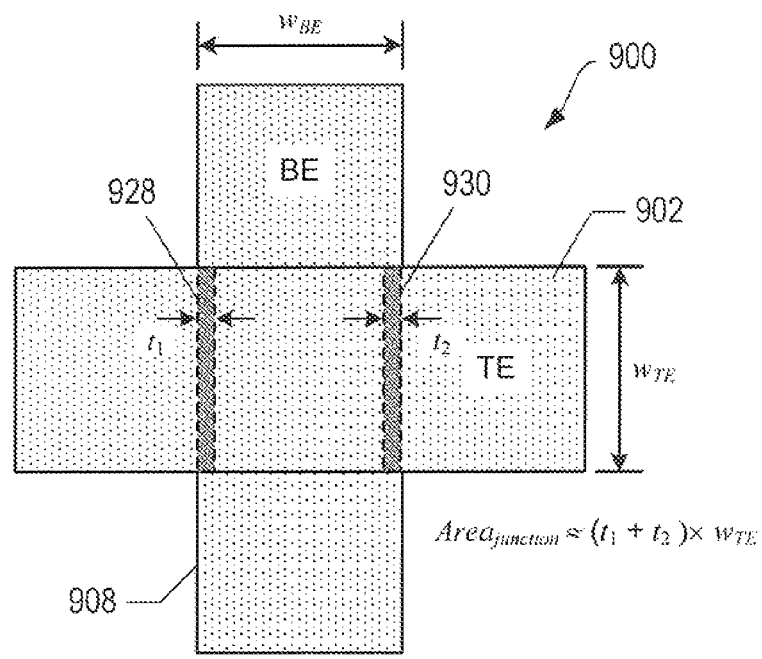
FIG. 9B shows a top view of the example memristor shown in FIG. 9A.

The electrode extension is not limited to having an L-shaped cross section as shown in FIGS. 6-8, Alternatively, the electrode extension can have a U-shaped cross section. FIG. 9A shows a cross-sectional view of an example memristor 900. The memristor 900 includes a TE 902, a switching layer 904, a dopant conductive layer 906, and a BE 908 embedded within an insulating material 910. The TE 902, switching layer 904, dopant conductive layer 906, and BE 908 can be composed of the same materials and configured in the same manner as the electrodes and layers of the memristor 600 or the memristor 700. The memristor 900 also includes an electrode extension 912 with a U-shaped cross-sectional geometry that includes a first sidewall 914, a second sidewall 916, and a base 918. The sidewall 914 includes a first adhesion layer 920 and a second barrier layer 922, and the sidewall 917 includes a second adhesion layer 924 and third barrier layer 926. As shown in the example of FIG. 9A, the BE 908 is in contact with the base 918. The sidewalls 914 and 916 define two ribbon-like junctions 928 and 930, where the thicknesses $t_1$ and $t_2$ of the sidewalls 914 and 916, respectively, define the thicknesses of the junctions 928 and 930. FIG. 9B shows a top view of the memristor 900. The junctions 928 and 930 each define a separate junction contact area given by $\sim t_1 \times w_{TE}$ and $\sim t_2 \times w_{TE}$, respectively, with the TE 902. In combination, the junctions 928 and 930 define a sum total junction contact area with the TE 902 given by:

$$\text{Area}_{junction} \approx (t_1 + t_2) \times w_{TE}$$

which is less that the overlap area $w_{TE} \times w_{BE}$ defined by the TB 902 and the BE 908. FIGS. 9A and 9B both show the junctions 928 and 930 located within the overlap region between the TB 902 and the BE 908.

Figure 10A:
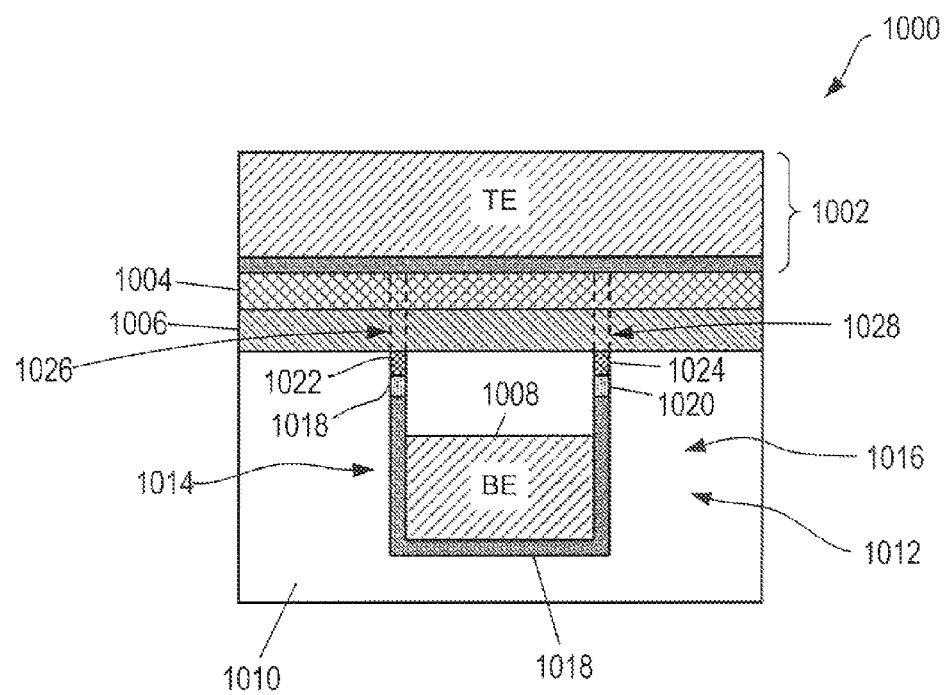
FIG. 10A shows a cross-sectional view of an example memristor.
Figure 10B:
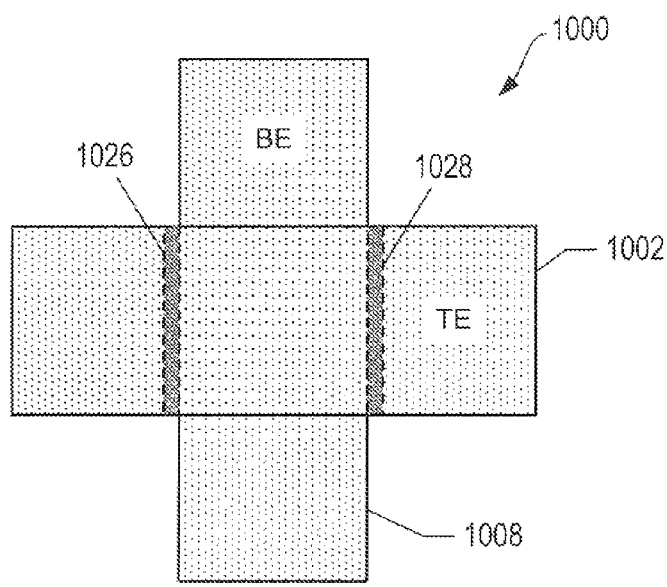
FIG. 10B shows a to view of the example memristor shown in FIG. 10A.

U-shaped electrode extensions are not limited to being disposed between the TB and the BE, as shown in FIG. 9. FIG. 10A shows a cross-sectional view of memristor 1000. The memristor 1000 includes a TB 1002, a switching layer 1004, a dopant conductive layer 1006, and a BE 1008 embedded within an insulating material 1010. The TB 1002, switching layer 1004, dopant conductive layer 1006, and BE 1008 can be composed of the same materials and configured in the same manner as the electrodes and layers of the memristor 600 or the memristor 700. The memristor 1000 also includes an electrode extension 1012 with a U-shaped cross-sectional geometry that includes a first sidewall 1014, a second sidewall 1016, and a base 1018. The sidewalls 1014 and 1016 can include corresponding adhesion layers 1018 and 1020 and second and third barrier layers 1022 and 1024. Unlike the U-shaped electrode extension 912 described above, the U-shaped electrode extension 1012 is configured so that the BE 1008 contacts the base 1018 and the sidewalls 1014 and 1016. The sidewalls 1014 and 1016 also define two ribbon-like junctions 1026 and 1028 within the layers 1004 and 1006 between the ends of the sidewalls 1014 and 1016, respectively, and the TE 1002. FIG. 10B shows a top view of the memristor 1000. FIGS. 10A-10B reveal that the total junction contact area of the two ribbon-like junctions 1026 and 1028 is a fraction of the overlap area between the TB 1002 and the BE 1008 and the two junctions 1026 and 1028 are located outside the overlap region.

Bulk Switching

Unlike interface switching, in bulk switching, there is no, or relatively little, electronic barrier at the junction/electrode interface. In other words, interface resistance is negligible and bulk resistance within the junction dominates. FIG. 11 shows a cross-sectional view of a memristor 1100 along the BE. The memristor 1100 is similar to the memristors 600 or 700 except the adhesion layer 626 in the sidewall 614 is omitted and the dopant conducting layer and the switching layer are replaced by a doped semiconductor layer 1102 and an undoped semiconductor layer 1104, respectively.

The layers 1102 and 1104 can be composed of an elemental and/or compound semiconductors. Elemental semiconductors include silicon ("Si"), germanium ("Ge"), and diamond ("C"). Compound semiconductors include group IV compound semiconductors, compound semiconductors, and II-VI compound semiconductors. Group IV compound semiconductors include combinations of elemental semiconductors, such as SiC and SiGe. III-V compound semiconductors are composed of column IIIa elements selected from boron ("B"), aluminum ("Al"), gallium ("Ga"), and indium ("In") in combination with column Va elements selected from N, P, arsenic ("As"), and antimony ("Sb"). compound semiconductors are classified according to the relative quantities of III and V elements, such as binary compound semiconductors, ternary compound semiconductors, quaternary compound semiconductors. The layers 1102 and 1104 can be composed of other types of suitable compound semiconductors including II-VI ternary alloy semiconductors and II-V compound semiconductors.

The dopants in the doped semiconductor layer 1102 can be p-type impurities, which are atoms that introduce vacant electronic energy levels called "holes" to the electronic band gaps of the active region. These dopants are also called "electron acceptors." In still other embodiments, the dopants in the layer 1102 can be n-type impurities, which are atoms that introduce filled electronic energy levels to the electronic band gap of the active region. These dopants are called "electron donors." For example, boron ("B"), Al, and Ga are p-type dopants that introduce vacant electronic energy levels near the valence band of the elemental semiconductors Si and Ge; and P, As, and Sb are n-type dopants that introduce filled electronic energy levels near the conduction band of the elemental semiconductors Si and Ge. In III-V compound semiconductors, column VI elements substitute for column V atoms in the III-V lattice and serve as n-type dopants, and column II elements substitute for column III atoms in the III-V lattice to form p-type dopants.

The sidewall 614 of the electrode extension 604 defines the thickness of a ribbon-like junction 1106 with a junction contact area ~$(t \times w_{TE})$ with the TE 608, which is a fraction of the overlap area $w_{BE} \times w_{TE}$ defined by the TE 608 and the BE 602. The height of the junction 1106 between the sidewall 614 and the TE 608 is denoted by L and w specifies the distribution of dopants within the junction 1106. It is proposed that resistance switching and charge transport within the junction 1105 is an atomic rearrangement of dopants that modulates the electronic current. The total resistance of the memristor 1100 is characterized by two variable resistors connected in series, where the resistances are given for the full length L of the junction 1106. In particular, the doped layer 1102 portion of the junction 1106 has a relatively low resistance $R_{on}$, and because the undoped layer 1104 portion of the junction 1106 has a low or approximately zero dopant concentration, the undoped portion of the junction 1106 has a relatively higher resistance $R_{off}$. FIG. 11 also includes a circuit diagram 1108 with a first resistor 1110 and a second resistor 1112 in series. The first resistor 1110 represents the undoped layer 1104 portion of the junction 1106 and has a relatively higher resistance than the second resistor 1112 representing the doped layer 1102 portion of the junction 1106.

Application of a switching voltage across the junction 1106 moves the boundary 1114 between the doped and undoped regions of the junction 1106 by causing dopants to drift into or away from the undoped portion of the junction 1106. For example, the doped layer 1102 portion of the junction 1106 expands when a drift field associated when a switching voltage of an appropriate polarity is applied, causing dopants to drift into the widened layer 1104 portion of the junction 1106. In other words, the switching voltage causes w to increase, the resistance across the junction 1106 to decrease, and the junction 1106 is switched into a low resistance state. By contrast, when the polarity of the switching voltage is reversed, the doped layer 1102 portion of the junction 1106 contracts because the drift field associated with the reverse polarity switching voltage causes dopants to drift, in the opposite direction expanding the undoped layer 1104 portion of the junction 1106. In other words, the reverse polarity switching voltage causes w to decrease, the resistance across the junction 1106 to increase, and the junction is switched into a high resistance state.

Memristors that use hulk switching at ribbon-like junctions are not limited to the single sidewall electrode extension configuration shown in FIG. 11. Other electrode extension configurations described above with reference to FIGS. 8-10 can be used in bulk switching of ribbon-like junctions.

Methods for Fabricating Memristive Devices with Electrode Extensions

Figure 12G:
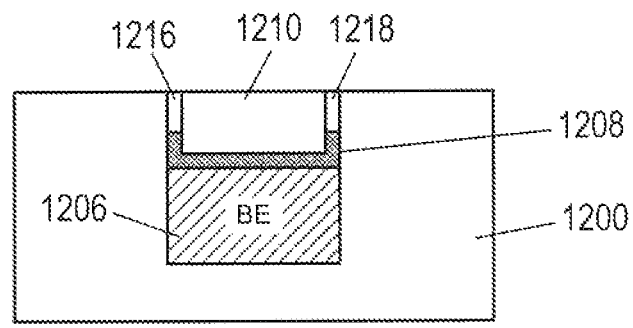
Figure 12H:
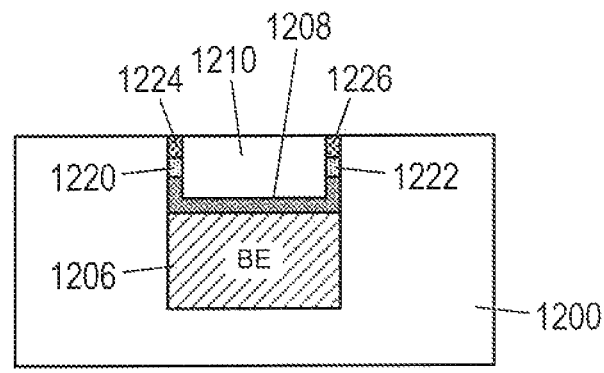
Figure 12I:
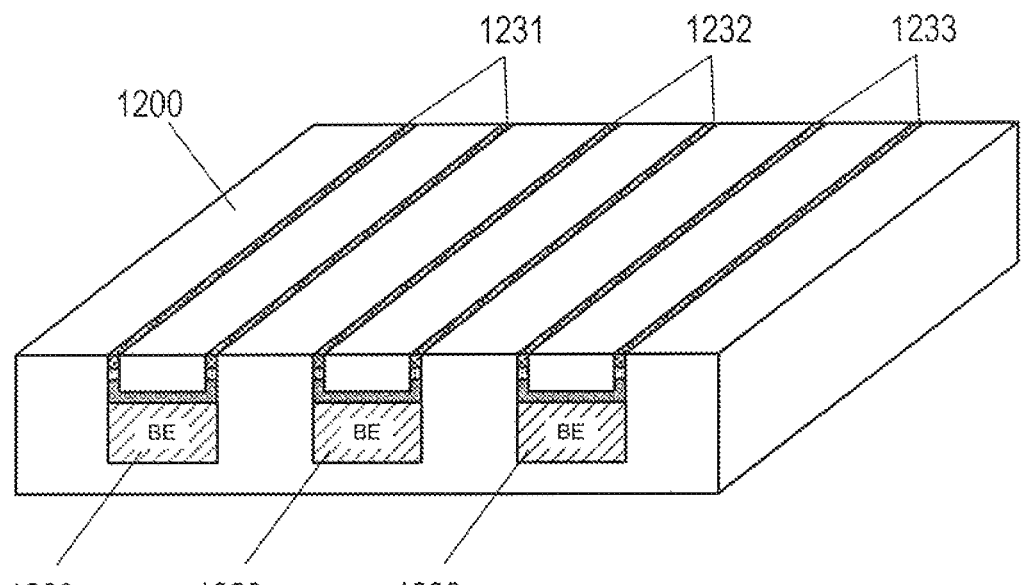

FIGS. 12A-12M show isometric and cross-sectional views of stages in fabricating an example memristive crossbar array with U-shaped electrode extensions at crossbar junctions configured as described above with reference to FIG. 9. In FIG. 12A, a series of approximately parallel grooves 1201-1203 are formed in a slab 1200 of insulating material, such $SiO_2$, $Al_2O_3$, or another suitable dielectric. The grooves 1201-1203 can he formed using chemical wet etching, reactive-ion etching ("RIE"), focused ion beam milling ("FIB"), or any other suitable technique for forming grooves in an insulating material. FIG. 12B, shows a cross-sectional view of a groove, such as groove 1202, filled with a conductive metal 1204, such as Cu, Al, W, Ag, or Pt. The conductive metal can be deposited in the grooves 1201-1203 using e-beam evaporation, sputtering, chemical vapor deposition, atomic layer deposition, electroplating, or another suitable thin film deposition technique. The surface of the dielectric slab 1200 with a conductive metal deposited in the grooves 1201-1203 can he planarized using chemical mechanical polishing ("CMP"). In FIG. 12C, the conductive metal 1204 is recess etched to form a BE 1206 embedded in the insulating material 1200 using chemical wet etching or dry etching such as RIE. In FIG. 12D, a thin layer 1208 of TiN, Pt, TaN, or W is conformally deposited using chemical vapor deposition ("CVD"), physical vapor deposition ("PVD"), or atomic layer deposition (ALD). In FIG. 12E, insulating material 1210 is deposited over the layer 1208 using spin on glass, CVD, or PVD. In FIG. 12F, the surface is planarized using CMP leaving a portion of the layer 1208 and insulating material 1210 to fill the groove. The layer 1208 includes sidewalls 1212 and 1214 and a base 1216 forming a U-shape electrode extension. In FIG. 12G, the sidewalls 1212 and 1214 are recess etched to a controlled depth using chemical wet etching or dry etching such as RIE to form recesses 1216 and 1218. In FIG. 12H, adhesion layers 1220 and 1222 and barrier layers 1224 and 1226 are formed by depositing a metal M, such as Ti, in the recesses 1216 and 1218 using physical vapor deposition, chemical vapor deposition, or atomic layer deposition; followed by planarizing using CMP; followed by controlled recess etching using chemical wet etching or dry etching such as RIE.; followed by depositing Pt using physical vapor deposition, chemical vapor deposition, or atomic layer deposition; followed by planarizing using CMP. FIG. 12I show an isometric view of three BEs 1228-1230 and three associated U-shaped electrode extensions 1231-1233.

Figure 12J:
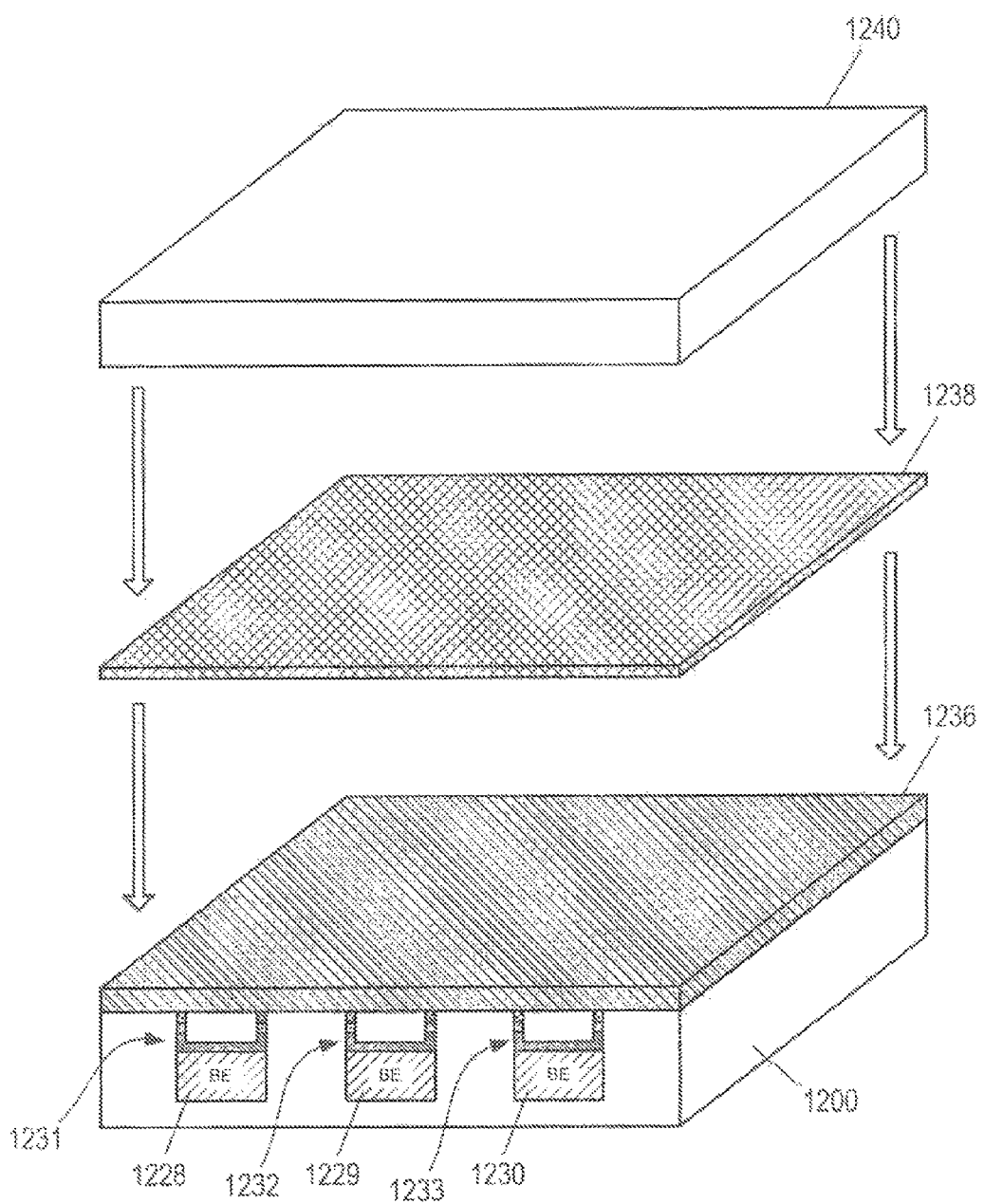
Figure 12K:
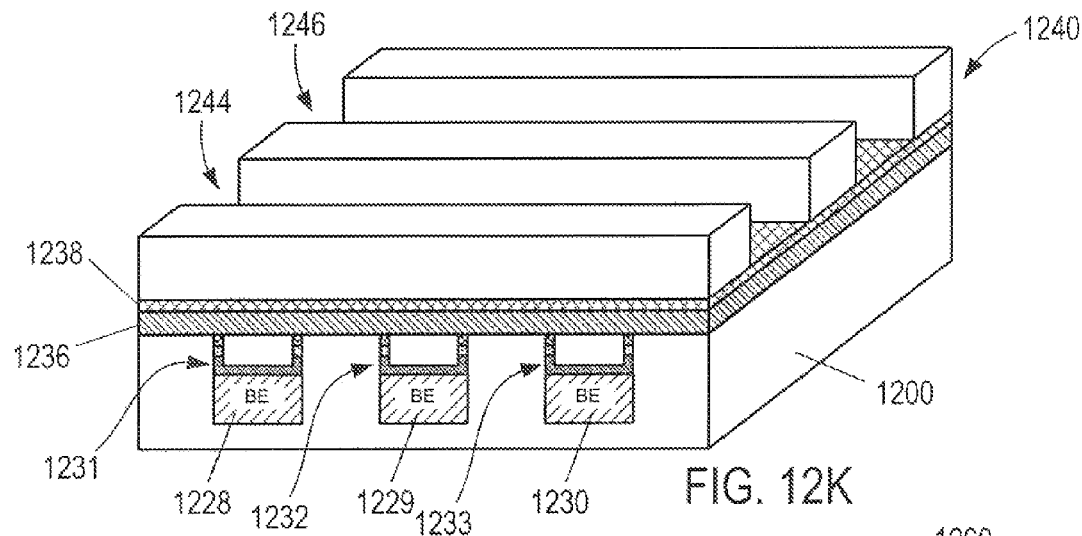
Figure 12L:
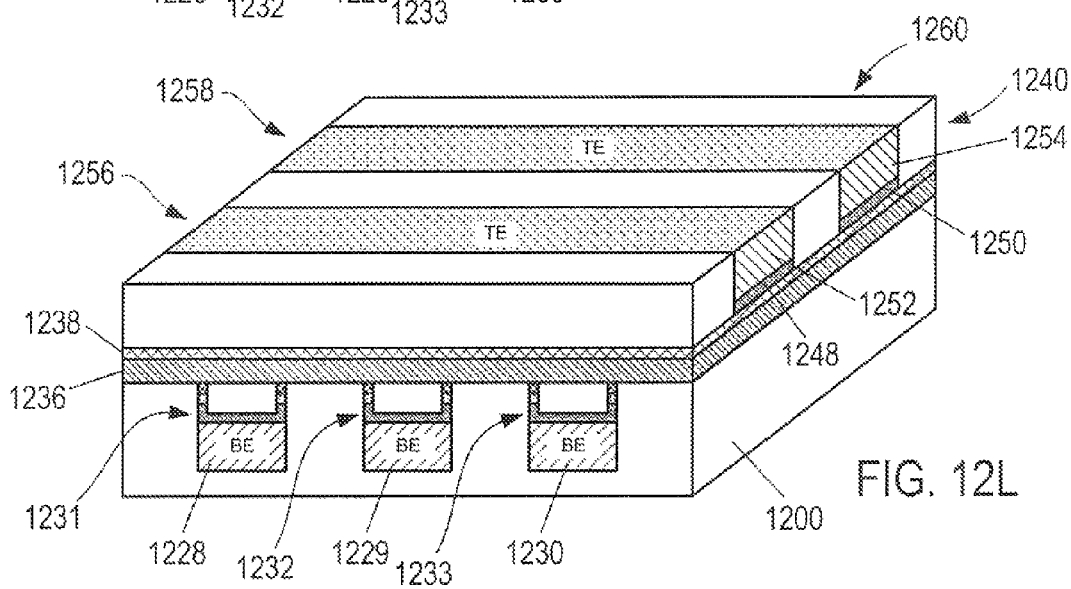
Figure 12M:
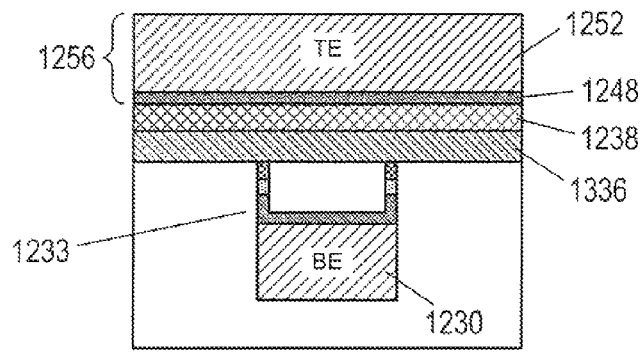

In FIG. 12J, using CVD or PVD, a dopant conductive, layer 1236, such as $M_aX_b$ is deposited followed by deposition of a switching layer 1236, such as MX, $MX_2$ or $MX_3$. FIG. 12J also shows deposition Of an insulating material 1240 using CVD or PVD. In FIG. 12K, grooves 1244 and 1246 are formed in the dielectric layer 1240 using chemical wet etching or dry etching such as RIE, exposing portions of the switching layer 1238. In FIG. 12L, using CVD, PVD, or ALD, barrier layers 1248 and 1250 composed of TIN, TaN, W, or Pt are deposited on the exposed portions of the switching layer 1238 and metal conductive layers 1252 and 1254, such as Cu, Al, W, TiN, Au, or Pt, are then deposited on the barrier layers 1248 and 1250 to form TEs 1256 and 1258. The top surface can be planarized using CMP to produce a memristive crossbar array 1260. FIG. 12M shows a cross-sectional view of the crossbar junction between the BE 1230 and the TE 1256.

Figure 13:
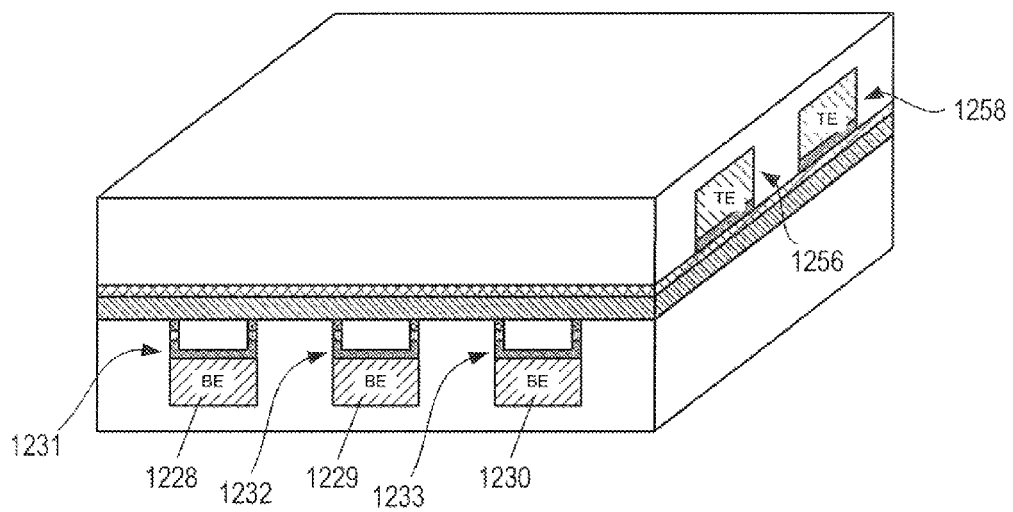
FIG. 13 shows top electrode wires and bottom electrode wires of an example crossbar array embedded in insulating material.

In FIG. 13, the TEs 1256 and 1258 can be embedded within an insulating material by depositing a layer of $SiO_2$, $Al2O_3$, or another dielectric material using wafer bonding, CVD, or PVD.

Figure 14:
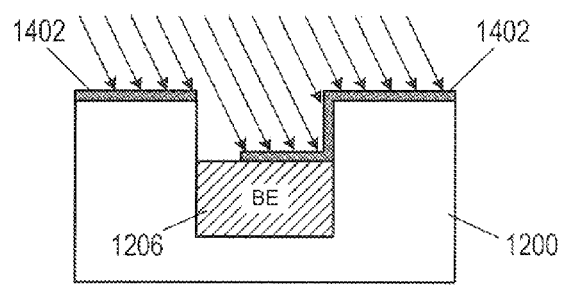
FIG. 14 shows an example of a barrier layer deposited at an angle onto portions of an insulating material and a bottom electrode wire.

L-shaped electrode extensions described above with reference to FIGS. 2, 6, and 7 can be formed by replacing the stage described above with reference to FIG. 12D with a process where the barrier layer is deposited at an angle using a directional deposition approach, for example, e-beam evaporation or ion beam assisted deposition. FIG. 14 shows a barrier layer 1402 deposited on portions of the insulating material 1200 and the BE 1206 at an angle.

Figure 15A:
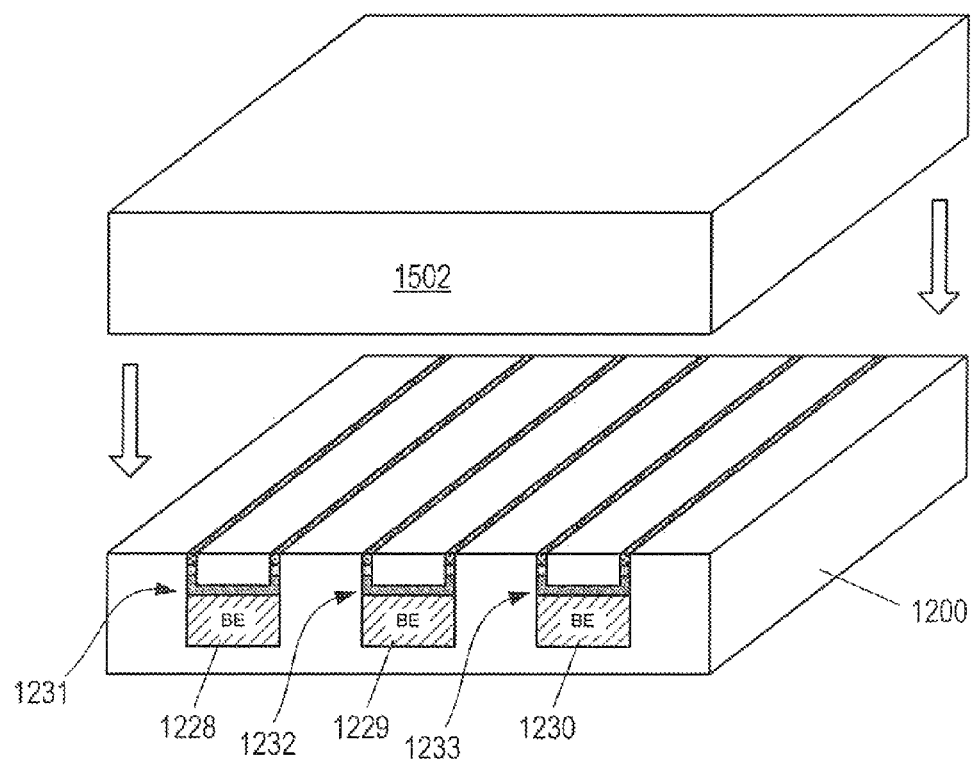
FIGS. 15A-15E show isometric and cross-sectional views of stages of a method for fabricating a memristive crossbar array.
Figure 15B:
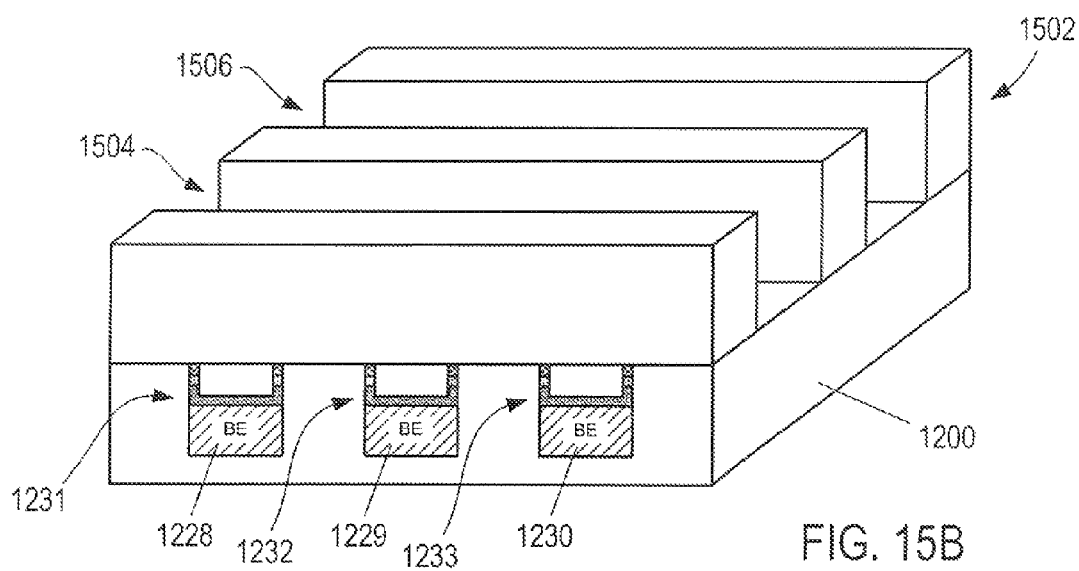
Figure 15C:
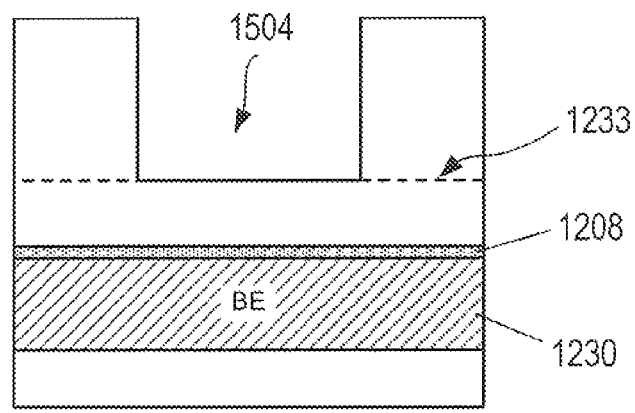
Figure 15D:
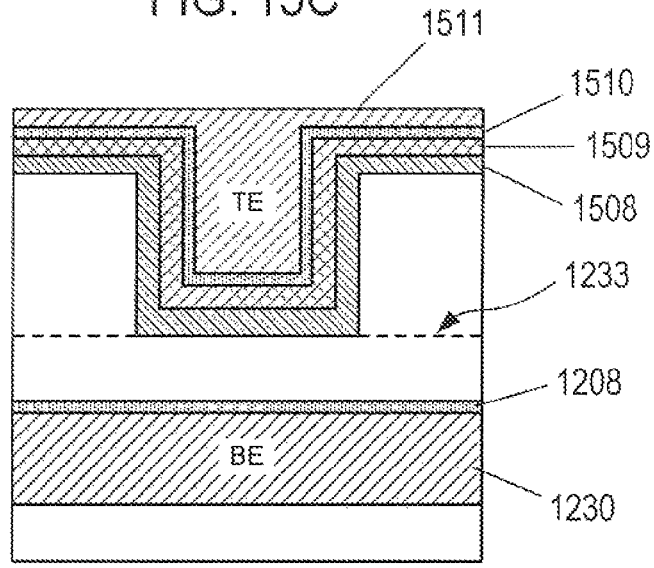
Figure 15E:
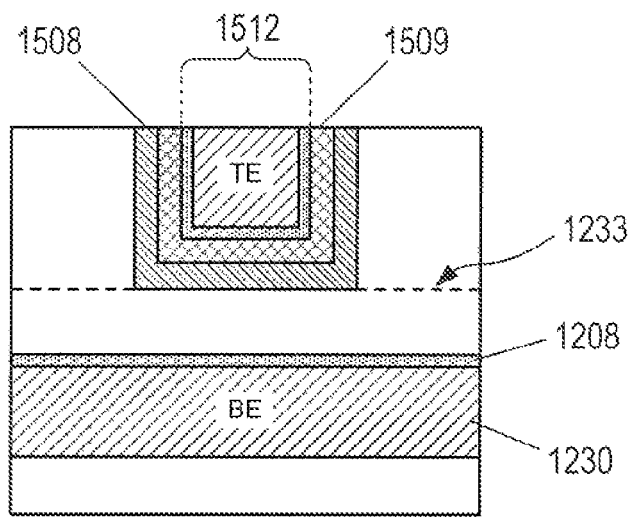

FIGS. 15A-15E show isometric and cross-sectional views of stages in fabricating an example memristive crossbar array with U-shaped electrode extensions at crossbar junctions where the TE is configured as described above with reference to FIG. 7. In FIG. 15A, the BEs 1228-1210 and associated bottom electrodes 1231-1233 are formed in the insulating material 1200 as described above with reference to FIGS. 12A-12J followed by deposition of insulating material 1502 using wafer bonding, CVD, or PVD. In FIG. 15B, grooves 1504 and 1506 are formed in the insulating material 1502 using chemical wet etching or dry etching such as RIE, exposing portions of the electrode extensions 1231-1233. FIG. 15C shows a cross-sectional view along the groove 1504 and reveals that the bottom of the groove 1504 reaches the top of the electrode extension 1233. in FIG. 15D, a dopant conductive layer 1508, a switching layer 1509, a barrier layer 1510 are deposited in order using CVD, PVD, ALD, or other thin film deposition techniques. A metal conductive layer 1511 is deposited using e-beam evaporation, sputtering, chemical vapor deposition, atomic layer deposition, electroplating, or another suitable thin film depostion technique. In FIG. 15E, the surface is planarized using CMP to isolate a TE 1512 and the layers 1508 and 1509 from other electrodes.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific embodiments are presented for purposes of illustration and description. They are not intended to be exhaustive of or to limit this disclosure to the precise forms described. Obviously, many modifications and variations are possible in view of the above teachings. The embodiments are shown and described in order to best explain the principles of this disclosure and practical applications, to thereby enable others skilled in the art to best utilize this disclosure and various embodiments with various modifications as are suited to the particular use contemplated. It is intended that the scope of this disclosure be defined by the following claims and their equivalents:

The invention claimed is:

1. A memristor comprising:
a first electrode wire;
a second electrode wire, wherein the second electrode wire and the first electrode wire define an overlap area;
an electrode extension in contact with the first electrode wire and disposed between the first and second electrode wires; and
at least one junction, wherein each junction contacts a portion of the electrode extension and has a junction contact area with the second electrode wire such that the sum total junction contact area of the at least one junction is less than the overlap area between the first and second electrodes,
wherein each junction further comprises a first interface with the second electrode wire and a second interface with the electrode extension such that the first interface is an Ohmic-like barrier and the second interface is switchable between an Ohmic-like barrier and a Schottky-like barrier with a switching voltage applied to at least one of the electrode wires.

2. The memristor of claim 1, wherein the electrode extension further comprises a base in contact with the first electrode wire and at least one sidewall that extends from the base to a plane between the first and second electrode wires, wherein the thickness of each sidewall defines the thickness of one of the at least one junctions.

3. The memristor of claim 1, wherein the electrode extension further comprises a base and at least one sidewall that extends from the base to a plane between the first and second electrode wires, the base and the at least one sidewall in contact with the first electrode wire and the thickness of each sidewall defines the thickness of one of the at least one junctions.

4. The memristor of claim 1, wherein each junction further comprises an undoped layer and a doped layer and is switchable between a low resistance state and high resistance state by expansion or contraction of the doped layer with a switching voltage applied to at least one of the electrodes.

5. A crossbar array comprising:
a first layer of approximately parallel wires;
a second layer of approximately parallel wires, wherein each second layer wire overlays the first layer wires;
electrode extensions, wherein each electrode extension contacts a first layer wire and is disposed between the first layer wire and the second layer wires;

at least one junction disposed between each second layer wire and an electrode extension, wherein each junction contacts the electrode extension and has a junction contact area with the second layer wire such that the sum total junction contact area of the at least one junction is less than an overlap area defined the second layer wire and the first layer wire in contact with the electrode extension, wherein each junction further comprises a first interface with the second layer wire and a second interface with the electrode extension such that the first interface is an Ohmic-like barrier and the second interface is switchable between an Ohmic-like barrier and a Schottky-like barrier with a switching voltage applied to at least one of the second layer wire and the first layer wire.

6. The crossbar array of claim 5, wherein each electrode extension further comprises a base in contact with the first layer wire and at least one sidewall that extends from the base to a plane between the first layer wire and the second layer wires, and wherein the at least one sidewall thickness defines the at least one junction thickness.

7. The crossbar array of claim 5, wherein each electrode extension further comprises a base and at least one sidewall that extends from the base to a plane between the first layer wire and the second layer wires, and wherein the base and the at least one sidewall are in contact with the first layer wire and the at least one sidewall thickness defines the at least one junction thickness.

8. The crossbar array of claim 5, wherein each junction further comprises an undoped layer and a doped layer and is switchable between a low resistance state and high resistance state by expansion or contraction of the doped layer with a switching voltage applied to at least one of the electrodes.

9. The crossbar array of claim 5, wherein the each second layer wire is inlaid in an insulating material.

10. A method for fabricating a memristor, the method comprising:
    forming a first electrode wire in a groove of an insulating layer;
    forming an electrode extension in the groove, the electrode extension having contact with the first electrode wire;
    depositing a switching material over the electrode extension; and
    forming a second electrode wire in a second insulating layer, wherein the electrode extension defines at least one junction in the switching material, wherein each junction contacts a portion of the electrode extension and has a junction contact area with the second electrode wire,
    wherein each junction further comprises a first interface with the second electrode wire and a second interface with the electrode extension such that the first interface is an Ohmic-like barrier and the second interface is switchable between an Ohmic-like barrier and a Schottky-like barrier with a switching voltage applied to at least one of the electrode wires.

11. The method of claim 10, wherein the sum total junction contact area of the at least one junction with the second electrode wire is less than the overlap area defined by first electrode wire and the second electrode wire.

12. The method of claim 10, wherein forming the electrode extension in the groove further comprises:
    depositing electrode extension material to coat a surface of the first electrode and walls of the groove;
    depositing a dielectric material over the electrode extension material to fill the groove volume; and
    planarizing the first insulating layer to remove excess electrode extension material and excess dielectric material deposited outside the groove.

13. The method of claim 10, wherein forming the electrode extension in the groove further comprises:
    depositing electrode extension material at an angle to coat a portion of an exposed surface of the first electrode and one wall of the groove;
    depositing a dielectric material over the electrode extension material to fill the groove volume; and
    planarizing the first insulating layer to remove excess electrode extension material and excess dielectric material deposited outside the groove.

* * * * *